United States Patent
Sun et al.

(10) Patent No.: US 8,020,082 B2
(45) Date of Patent: Sep. 13, 2011

(54) SOURCE-CHANNEL APPROACH TO CHANNEL CODING WITH SIDE INFORMATION

(75) Inventors: Yong Sun, Hoffman Estates, IL (US); Angelos D. Liveris, Sugar Land, TX (US); Vladimir M. Stanković, Lancaster (GB); Zixiang Xiong, Spring, TX (US)

(73) Assignee: The Texas A & M University System, College Station, TX (US)

( * ) Notice: Subject to any disclaimer, the term of this patent is extended or adjusted under 35 U.S.C. 154(b) by 1222 days.

(21) Appl. No.: 11/684,427

(22) Filed: Mar. 9, 2007

(65) Prior Publication Data

US 2007/0217522 A1 Sep. 20, 2007

Related U.S. Application Data

(60) Provisional application No. 60/782,416, filed on Mar. 15, 2006.

(51) Int. Cl.
*G06F 11/00* (2006.01)

(52) U.S. Cl. .......................... 714/800; 714/758; 714/794

(58) Field of Classification Search .................. 714/800, 714/758, 785, 792, 801, 794
See application file for complete search history.

(56) References Cited

U.S. PATENT DOCUMENTS 5,499,254 A * 3/1996 Ikekawa et al. ................ 714/794
7,746,758 B2 * 6/2010 Stolpman ....................... 370/203

OTHER PUBLICATIONS

Bennatan et al., "Superposition Coding for Side-Information Channels," IEEE Trans. Inform. Theory, vol. 52, No. 5, pp. 1872-1889, May 2006.

Chen et al., "Achievable Performance of Digital Watermarking Systems," in Proc. IEEE Int. Conf. Multimedia Comput. Syst., pp. 13-18, Florence, Italy, Jun. 1999.

Chou et al., "Turbo Coded Trellis-Based Constructions for Data Embedding: Channel Coding with Side Information," in Proc. of 35th Asilomar Conf. Signals, Systems and Computers, pp. 305-309, Pacific Grove, Ca, Nov. 2001.

Shamai et al, "The Intersymbol Interference Channel: Lower Bounds on Capacity and Channel Precoding Loss," IEEE Trans. Info. Theory, vol. 42, No. 5, pp. 1388-1404, Sep. 1996.

Costa, "Writing on Dirty Paper," IEEE Trans. Inform. Theory, vol. IT-29, No. 3, pp. 439-441, May 1983.

Eggers et al., "Scalar Costa Scheme for Information Embedding," IEEE Trans. Signal Processing, vol. 51, No. 4, pp. 1003-1019, Apr. 2003.

Erez et al., "A Close-to-Capacity Dirty Paper Coding Scheme," IEEE Trans. Inform. Theory, vol. 51, No. 10, pp. 3417-3432, Oct. 2005.

Gel'Fand et al., "Coding for Channel with Random Parameters," Probl. Contr. and Inform. Theory, vol. 9, pp. 19-31, 1980.

(Continued)

*Primary Examiner* — Fritz Alphonse
(74) *Attorney, Agent, or Firm* — Knobbe, Martens, Olson & Bear LLP

(57) ABSTRACT

Code designs for channel coding with side information (CCSI) based on combined source-channel coding are disclosed. These code designs combine trellis-coded quantization (TCQ) with irregular repeat accumulate (IRA) codes. The EXIT chart technique is used for IRA channel code design (and especially for capacity-approaching IRA channel code design). We emphasize the role of strong source coding and endeavor to achieve as much granular gain as possible by using TCQ. These code designs synergistically combine TCQ with IRA codes. By bringing together TCQ and EXIT chart-based IRA code designs, we are able to approach the theoretical limit of dirty-paper coding.

32 Claims, 19 Drawing Sheets

OTHER PUBLICATIONS

Jin et al., "Irregular Repeat-Accumulate Codes," in Proc. 2nd Intl. Symp. Turbo codes and Related Topics, pp. 1-8, Sep. 2000.

Marcellin et al., "Trellis Coded Quantization of Memoryless and Gauss-Markov Sources," IEEE Trans. Communications, vol. 38, No. 1, pp. 82-93, Jan. 1990.

Stankovic et al., "Cooperative Diversity for Wireless Ad Hoc Networks: Capacity Bounds and Code Designs," IEEE Signal Processing Magazine, vol. 23, pp. 37-49, Sep. 2006.

Sun et al., "Near-Capacity Dirty-Paper Code Design: A Source-Channel Coding Approach," in Proc. CISS'05, pp. 1-6, Baltimore, MD, Mar. 2005.

Sun et al., "Near-Capacity Dirty-Paper Code Designs Based on TCQ and IRA Codes," in Proc. ISIT'05, Adelaide, Australia, Sep. 2005.

Sun et al., "Nested Turbo Codes for the Costa Problem," IEEE Trans. Communications, vol. 56, No. 3, pp. 388-399, Mar. 2008.

Brink, "Convergence Behavior of Iteratively Decoded Parallel Concatenated Codes," IEEE Trans. Communications, vol. 49, No. 10, pp. 1727-1737, Oct. 2001.

Ungerboeck, "Channel Coding with Multilevel/Phase Signals," IEEE Trans. Inform. Theory, vol. IT-28, No. 1, pp. 55-67, Jan. 1982.

Uppal et al., "Code Designs for MIMO Broadcast Channels," in Proc. ISIT'06, pp. 2627-2631, Seattle, WA, Jul. 2006.

Xiong et al., "Source-Channel Coding for Algebraic Multiterminal Binning," in Proc. ITW'04, pp. 318-323, San Antonio, TX, Oct. 2004.

Yang et al., "Wyner-Ziv Coding Based on TCQ and LDPC Codes," IEEE Trans. Communications, pp. 1-11, to be published.

Yang et al., "Image Data-Hiding Based on Capacity-Approaching Dirty-Paper Coding," in Proc. SPIE EI'06: Security, Steganography, and Watermarking of Multimedia Contents VIII, pp. 1-11, San Jose, CA, Jan. 2006.

Yang et al., "On Multiterminal Source Code Design," IEEE Trans. Inform. Theory, vol. 54, No. 5, pp. 2278-2302, May 2008.

Yu et al., "Trellis and Convolutional Precoding for Transmitter-Based Interference Pre-Subtraction," IEEE Trans. Communications, vol. 53, No. 7, pp. 1220-1230, Jul. 2005.

Zamir et al., "Nested Linear/Lattice Codes for Structured Multiterminal Binning," IEEE Trans. Inform. Theory, vol. 48, No. 6, pp. 1250-1276, Jun. 2002.

* cited by examiner

Fig. 2 $M_{NE}$

```
receive message bits from an information source  110
```
↓
```
perform channel coding on the message bits using an irregular repeat accumulate (IRA)
                  encoder to generate parity bits  115
```
↓
```
serialize the parity bits to generate a serial stream q   116
```
↓
```
expand each bit q_i of the stream q to generate an A-bit word, thus producing a stream Q
                            of A-bit words       117
```
↓
```
scale a stream S of channel state values to obtain a stream of scaled values  120
```
↓
```
add a stream D of dither values to the stream of scaled values in order to generate a
                        stream of intermediate values  125
```
↓
```
operate on the words of the stream Q to obtain a stream G of modified words, where this
  operation includes adding one or more binary control streams to a number of the A
   substreams of the stream Q, where the control streams are generated as the output of a
            trellis coded quantization in response to an input vector b  130
```
↓
```
perform pulse amplitude modulation (PAM) based on the stream G of modified words to
                       obtain a modulated signal u  135
```
↓
```
subtract the stream of intermediate values from the signal u to obtain a stream X of
   difference values, where the input vector b, used to generate the control streams, is
      optimized so that the power associated with the stream X of difference values is
                    minimized (or approximately minimized)  140
```

Table I

| # of states in TCQ | $g(\Lambda)$ (dB) | $\Delta SNR_m$ (dB) | $\Delta SNR_p$ (dB) | $\Delta SNR$ (dB) |
|---|---|---|---|---|
| 256 | 1.33 | 0.65 | 0.34 | 0.99 |
| 512 | 1.36 | 0.56 | 0.34 | 0.90 |
| 1024 | 1.38 | 0.49 | 0.34 | 0.83 |
| 2048 | 1.40 | 0.43 | 0.34 | 0.77 |

Fig. 10

SOURCE-CHANNEL APPROACH TO CHANNEL CODING WITH SIDE INFORMATION

PRIORITY DATA

This application claims the benefit of U.S. Provisional Application No. 60/782,416, filed on Mar. 15, 2006, entitled "Near-capacity Dirty-paper Code Design: A Source-Channel Coding Approach", invented by Sun, Liveris, Stanković and Xiong, which is hereby incorporated by reference in its entirety.

FIELD OF THE INVENTION

The present invention relates to the field of information encoding/decoding, and more particularly to systems and methods for addressing the so-called "dirty paper" coding problem.

DESCRIPTION OF THE RELATED ART

The notation "[n]" is used repeatedly in this specification and is to be interpreted as a reference to the $n^{th}$ document in the list of references appearing at the end of this specification.

Communicating over side-information channels constitutes a powerful paradigm that is built upon the framework of channel coding with side information (CCSI), where the channel state is known only to the encoder as side information. CCSI has recently generated a lot of interest due to its application to data-hiding, preceding for interference channels, coding for MIMO broadcast channels, and transmitter cooperation in ad hoc networks. However, although the capacity results obtained by Gelfand and Pinsker [8] and by Costa in the special case of the so-called problem of "writing on dirty paper" [5] have been known for more than 20 years, practical approaches to CCSI did not appear until 1999.

The general framework of CCSI, described by Gelfand and Pinsker [8], is shown in FIG. 1. A transmitter wishes to communicate messages to a receiver over a noisy channel. Thus, the transmitter sends encoded messages, $m \in \{1, \ldots, M\}$, over a memoryless channel defined by the transition probabilities $p(y|x,s)$, where X and Y are the channel input and output, respectively, and the independent identically distributed (i.i.d.) random variable S is the state of the channel (side information) known non-causally to the encoder but not to the decoder. X and Y are related by $$Y = X + S + Z \quad (1)$$

where Z is the noise in the channel. Based on the selected message m and the state of the channel S, the encoder sends codeword X which satisfies the power constraint $E[w(X, S)] \leq P_X$, with $w(\bullet, \bullet)$ being the cost measure. The achieved transmission rate is then $R = \log_2 M$.

The capacity is given by [8] as $$C^* = \max_{p(u,x|s)} [I(U;Y) - I(U;S)], \quad (2)$$

where U is an auxiliary random variable such that two Markov chains $Y \to (X,S) \to U$ and $Y \to (U,S) \to X$ hold, and $E[w(X,S)] \leq P_X$.

CCSI in general suffers capacity loss when compared to channel coding with side information available at both the encoder and the decoder. However, when Z is i.i.d. Gaussian random variable with variance $P_Z$, we have the famous dirty-paper coding problem [5] without capacity loss, i.e., $$C^* = \frac{1}{2} \log_2 \left(1 + \frac{P_X}{P_Z}\right). \quad (3)$$

Costa's proof [5], which shows the existence of capacity-achieving random binning schemes, is non-constructive. Thus, it does not provide any indication about practical code construction. Zamir et al. [23] suggested an algebraic binning scheme based on nested lattice codes and showed that the scheme approaches the capacity in (3) as the dimensionality of the employed lattices approaches infinity. However, nested lattice coding requires a joint source-channel code design, typically with the same dimensional coarse lattice source code and fine lattice channel code, which are difficult to implement in high dimensions.

The first practical dirty-paper code was developed by Chen and Wornell under the name of quantization index modulation [2]. Eggers et al. [6] proposed a scalar Costa scheme for information embedding. Yu et al. [22] employed trellis-coded quantization (TCQ) [10] as the source code and trellis-coded modulation (TCM) [16] as the channel code. These dirty-paper coding schemes perform several dB away from the capacity. Another implementation using turbo-coded trellis-based construction was designed by Chou et al. [3]. However, the employed TCQ source code is significantly weakened due to its coupling with turbo code, resulting in dimensional mismatch [18] between the source code and the channel code. Indeed, at a transmission rate of 1.0 bit per sample (b/s), the design of [3] performs 2.02 dB away from the capacity.

The designs above do not perform well at low rate where the dirty-paper code design is more challenging due to magnification of the granular loss of the source code (see [18]). Recent works by Erez and ten Brink [7] and by Bennatan et al. [1] target at the low rate regime. However, the code designs in [7][1] still show a 1.3 dB gap from the capacity-achieving signal-to-noise ratio (SNR) at 0.25 b/s.

SUMMARY

In one set of embodiments, a method for encoding data may involve: performing channel coding on a set of message bits using an irregular repeat accumulate (IRA) encoder in order to generate parity bits; expanding the parity bits to obtain a stream of parity words; operating on the stream of parity words to obtain a stream of modified parity words, where said operating includes adding one or more binary control streams to corresponding bit positions of the stream of parity words, where the one or more binary control streams are outputs of a trellis coded quantization in response to an input vector b; performing pulse amplitude modulation based on the stream of modified parity words to obtain a modulated signal u; subtracting a scaled and dithered version of a channel state signal from the modulated signal u to obtain a difference signal X; where the input vector b has been selected so that the difference signal X satisfies a power constraint.

In another set of embodiments, a method for recovering message bits from a received is signal may involve: (a) performing a trellis decoding operation on a scaled and dithered version of a received signal using first feedback information to determine first feedforward information, wherein the trellis decoding operation is over a joint trellis corresponding at least to an accumulator portion of an IRA encoder and a trellis coded quantization; (b) subtracting the first feedback information from the first feedforward information to obtain second feedforward information; (c) performing check node decoding on the second feedforward information and second feedback information to generate third feedforward information, where the check node decoding corresponds to check nodes of the IRA encoder; (d) subtracting the second feedback information from the third feedforward information to obtain fourth feedforward information; (e) performing variable node decoding on a permuted version of the fourth feedforward information to obtain third feedback information, where the variable node decoding corresponds to variable nodes of the IRA encoder; (f) subtracting the permuted version of the fourth feedforward information from the third feedback information to obtain fourth feedback information, where the second feedback information is a permuted version of the fourth feedback information; (g) performing check node decoding on the second feedback information to determine the first feedback information, where the check node decoding corresponds to the check nodes of the IRA encoder; (h) repeating (a) through (g) a number of times until a termination condition is achieved; and (i) generating an estimate for the message bits from the third feedback information.

In yet another set of embodiments, a method for encoding data may involve: performing channel coding on a set of message bits using an irregular repeat accumulate (IRA) encoder in order to generate parity bits; expanding the parity bits to obtain a stream of parity words; operating on the stream of parity words to obtain a stream of modified parity words, where said operating includes adding one or more binary control streams to corresponding bit positions of the stream of parity words, where the one or more first binary control streams are outputs of a first trellis coded quantization in response to an input vector $b_P$; performing a first pulse amplitude modulation based on the stream of modified parity words to obtain a modulated signal $u_P$; expanding the message bits to obtain a stream of expanded words; operating on the stream of expanded words to obtain a stream of modified expanded words, where said operating includes adding one or more additional binary control streams to corresponding bit positions of the stream of expanded words, where the one or more additional binary control streams are outputs of a second trellis coded quantization in response to an input vector $b_S$; performing a second pulse amplitude modulation based on the stream of modified expanded parity words to obtain a modulated signal $u_S$; generating a signal u from the modulated signal $u_P$ and the modulated signal $u_S$; subtracting a scaled and dithered version of a channel state signal from the signal u to obtain a difference signal X; where the input vectors $b_P$ and $b_S$ have been selected so that the difference signal X satisfies a power constraint.

In yet another set of embodiments, a method for recovering message bits from a received signal may involve: (a) performing a first trellis decoding operation on a parity portion of a scaled and dithered version of a received signal using first feedback information to determine first feedforward information, wherein the first trellis decoding operation is over a joint trellis corresponding at least to an accumulator portion of an IRA encoder and a first trellis coded quantization; (b) subtracting the first feedback information from the first feedforward information to obtain second feedforward information; (c) performing check node decoding on the second feedforward information and second feedback information to generate third feedforward information, where the check node decoding corresponds to check nodes of the IRA encoder; (d) subtracting the second feedback information from the third feedforward information to obtain fourth feedforward information; (e) performing variable node decoding on a permuted version of the fourth feedforward information to obtain third feedback information and fourth feedback information, where the variable node decoding corresponds to variable nodes of the IRA encoder; (f) subtracting the permuted version of the fourth feedforward information from the fourth feedback information to obtain fifth feedback information, where the second feedback information is a permuted version of the fifth feedback information; (g) performing check node decoding on the second feedback information to determine the first feedback information, where the check node decoding corresponds to the check nodes of the IRA encoder; (h) performing a second trellis decoding operation on a systematic portion of a scaled and dithered version of the received signal using the third feedback information to determine fifth feedforward information, wherein the second trellis decoding operation is over a joint trellis corresponding at least to a second trellis coded quantization; (i) subtracting the third feedback information from the fifth feedforward information to obtain sixth feedforward information, wherein said performing variable node decoding uses the sixth feedforward information; (j) repeating (a) through (i) a number of times until a termination condition is achieved; and (k) generating an estimate for the message bits from the fourth feedback information.

A combined source-channel coding approach to CCSI (e.g., dirty-paper coding) is presented herein. In one set of embodiments, in addition to channel coding, strong source coding is employed to satisfy the power constraint due to the presence of encoder side information. To synergistically combine a strong source code and a strong channel code together, we follow a simple design philosophy of picking a strong source code first and then focusing on designing near-capacity channel codes. Specifically, we present practical code designs using TCQ, in conjunction with both non-systematic and systematic irregular repeat-accumulate (IRA) codes. (For more information on TCQ, please refer to [10]. For more information on IRA codes, please refer to [9]).

We endeavor to achieve as much granular gain as possible from TCQ. The aim of IRA coding then is to approach the capacity of the equivalent modulo lattice channel induced by TCQ.

We tackle the problem of designing efficient IRA codes for the TCQ-induced (modulo lattice) channel, whose memory increases with that of TCQ. The performance of TCQ is not compromised and the end results are CCSI codes (e.g., dirty-paper codes) with better performance at lower complexity. For example, at 0.25 b/s, one of our code designs (with 1024-state TCQ) performs only 0.83 dB away from the capacity. We are thus approaching the limit of dirty-paper coding.

We design IRA codes for the TCQ-induced channel using advanced tools such as EXIT charts. For more information on EXIT charts, please refer to [15]. (EXIT is an acronym for extrinsic information transfer.)

BRIEF DESCRIPTION OF THE DRAWINGS

The following detailed description makes reference to the accompanying drawings, which are now briefly described.

FIG. 2 illustrates one embodiment of a method $M_{NE}$ for the encoding of message information. The method $M_{NE}$ involves both trellis-coded quantization (TCQ) and irregular repeat accumulate (IRA) encoding.

FIG. 10 is a table illustrating the modulo loss $SNR_M$ for TCQ of different numbers of states and the predicted total performance loss $\Delta SNR$ in embodiments of our dirty-paper code designs, assuming the packing loss $SNR_P$ from IRA codes is 0.34 dB and a target rate of C*=0.25 b/s.

Figure 1:
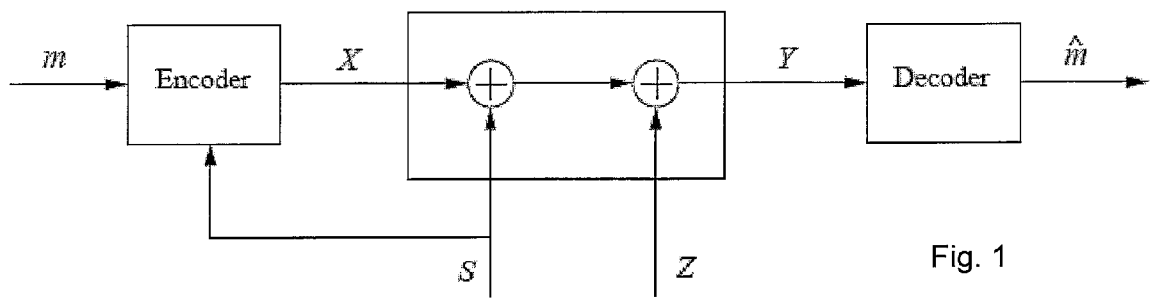
FIG. 1 illustrates the general framework of channel coding with side information (CCSI).

While the invention is described herein by way of example for several embodiments and illustrative drawings, those skilled in the art will recognize that the invention is not limited to the embodiments or drawings described. It should be understood, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description or the claims. As used throughout this specification, the word "may" is used in a permissive sense (i.e., in the sense of "having the potential to"), rather than in the mandatory sense (i.e., in the sense of "must"). Furthermore, the phrase "A includes B" is used to mean "A includes B, but is not limited to B".

DETAILED DESCRIPTION

In one set of embodiments, a method $M_{NE}$ for encoding data may involve the following actions/operations as illustrated in FIG. 2. The method $M_{NE}$ may be performed by a processor (or a set of processors) which is configured to read program instructions from a memory and execute the program instructions. Thus, the method $M_{NE}$ may be encoded in the program instructions.

At 110, the processor receives message bits (e.g., in the form of a K-bit word, where K is a positive integer) from an information source. The type of information provided by the information source is not limited. Typical examples of types of information that may be provided include audio, image, video, text, physical measurements, stock market data, covert intelligence data, etc.

At 115, the processor performs channel coding on the message bits using an irregular repeat accumulate (IRA) encoder in order to generate parity bits. In one embodiment, the IRA encoder may have the structure illustrated in FIG. 11. Please refer to the section below entitled "TCQ Plus Non-Systematic IRA Code Design" for information on how to design at least one embodiment of the IRA encoder.

At 116, the processor serializes the parity bits generated by the IRA encoder in order to generate a serial stream q.

At 117, the processor expands each bit $q_i$ of the stream q to generate an A-bit word, where A is an integer greater than one. (For example, in one embodiment, A equals 4.) If the bit $q_i$ equals one, the generated word has all ones. If the bit $q_i$ equals zero, the generated word has all zeros. Thus, the stream q is converted into a stream of words. The stream of words is denoted Q. The stream Q can be viewed as having A single-bit substreams which are denoted $Q^1, Q^2, \ldots, Q^A$. The substream $Q^j$ is composed of the $j^{th}$ bit of each word in the stream Q.

At 120, the processor scales a signal S to obtain a scaled signal. The signal S represents information about the state of the channel, and thus, may be referred to herein as the channel state signal. (It is assumed that the signal S and a noise signal Z are added to the signal X as part of the channel. See FIGS. 1 and 11.) The channel state signal S may be provided to the processor as a discrete-time signal, i.e., as a stream of channel state values. Thus, the processor may scale the stream of channel state values to obtain a stream of scaled values. The scaling operation may involve multiplying each channel state value of the signal S by scaling factor α. In one embodiment, the scaling factor α may be set equal to the mean square error ($M_{SE}$)-optimal $$\alpha = \frac{P_X}{P_X + P_Z} = \frac{SNR}{SNR+1},$$

where $P_X$ is the power limit on the signal X, $P_Z$ is the variance of the noise signal Z, and SNR is $P_X/P_Z$.

At 125, the processor adds a dither signal D to the scaled signal in order to generate an intermediate signal. In particular, the processor adds values of the dither signal to values of the scaled signal, respectively, in order to generate values of the intermediate signal. The values of the dither signal may be random values. In some embodiments, the dither values may be uniformly distributed over the Voronoi region of the quantizer. In one embodiment, the dither values may be generated (or computed) as described in the section below entitled "CCSI using TCQ and IRA codes". The mean of the dither values may be zero.

At 130, the processor operates on the words of the stream Q to obtain a stream G of modified words. This operation 130 may include adding binary control streams $C_1, C_2, \ldots, C_L$ respectively to L of the A substreams of the stream Q. (L is a positive integer less than or equal to A. For example, in the embodiment of FIG. 11, L equals two.) The additions may be performed in a "mod 2" fashion. The control streams $C_1, C_2, \ldots, C_L$ may be generated as the output of a trellis coded quantization in response to an input vector b whose components are binary values. In some embodiments, the operation 130 may be performed as suggested in FIG. 11. The trellis-coded quantization (TCQ) may be performed as described in the section below entitled "TCQ Plus Non-Systematic IRA Code Design".

At 135, the processor performs pulse amplitude modulation (PAM) based on the stream G of modified words to obtain a modulated signal u having a finite number of amplitude states. (The PAM may be $2^A$-state PAM. For example, in one embodiment, A equals 4.) PAM and methods for performing PAM are well known in the art of signal processing. In alternative embodiments, other types of modulation may be used.

At 140, the processor subtracts the intermediate signal from the modulated signal u to obtain a difference signal X. In particular, the processor may subtract the values of the intermediate signal from values of the signal u, respectively, to obtain values of the difference signal X.

In some embodiments, the difference signal X may be transmitted over a channel to a decoder system.

In some embodiments, the difference signal X may be used to modulate an RF carrier in order to generate an RF output signal. The RF output signal may be transmitted over the channel.

In some embodiments, the difference signal X may be added to the channel state signal S to obtain a resultant signal R. The resultant signal R may be transmitted to one or more destinations over one or more channels. Alternatively, the resultant signal may be stored in a memory medium for later retrieval. For example, the resultant signal may be stored in the memory of a server computer, and thus, made available to users of a computer network.

The input vector b, used to generate the control streams, will have been selected so that the difference signal X satisfies a power constraint. In some embodiments, the input vector b is selected so that the power associated with the difference signal X is minimized (or approximately minimized). The processor may perform an optimization (e.g., an optimization based on the Viterbi algorithm) to determine the input vector b.

Figure 3:
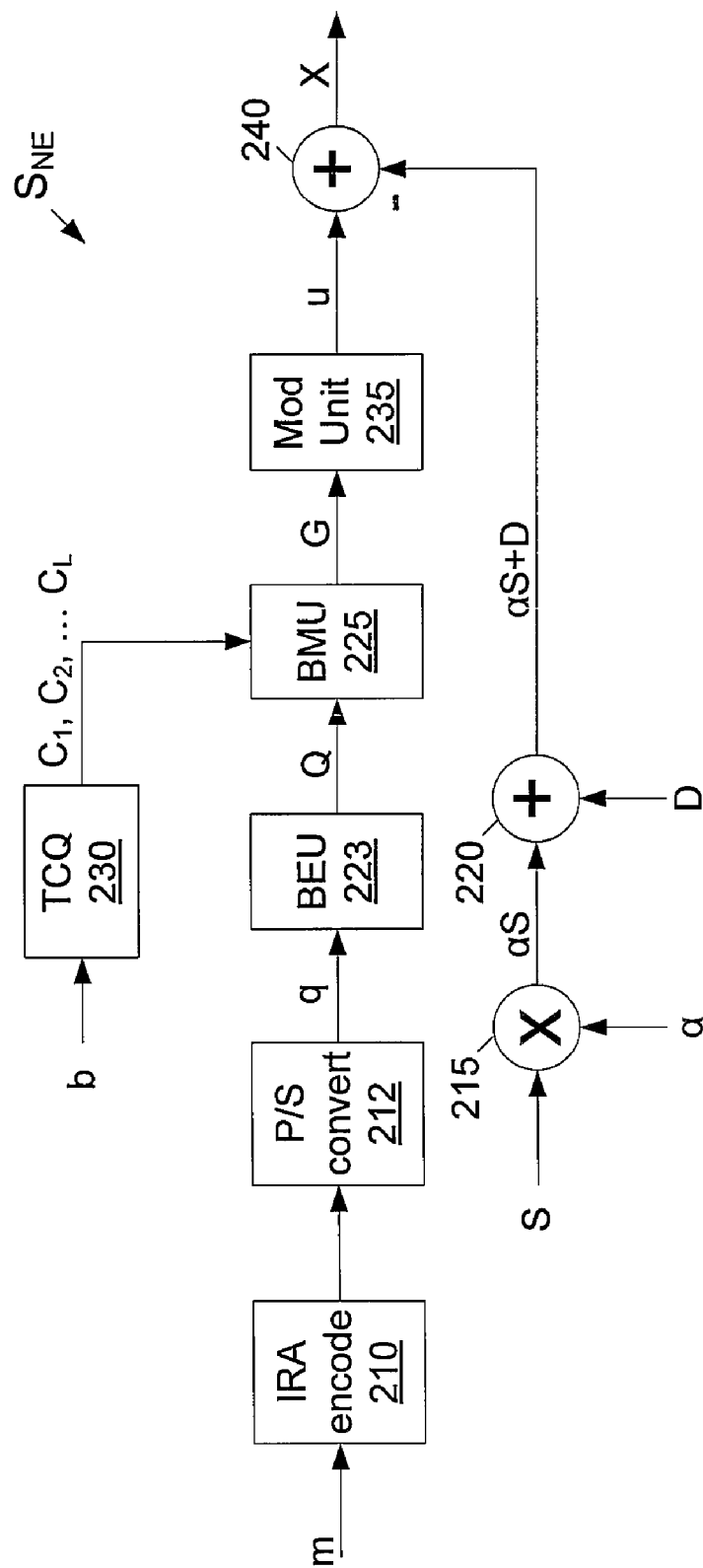
FIG. 3 illustrates one embodiment of a system $S_{NE}$ for encoding message information that involves both trellis-coded quantization (TCQ) and irregular repeat accumulate (IRA) encoding.

In one set of embodiments, the processing operations of the method $M_{NE}$ described above and illustrated in FIG. 2 may be performed in an encoder system $S_{NE}$ including a set of analog and/or digital circuit units, e.g., as suggested in FIG. 3. The encoder system $S_{NE}$ may include an IRA encoder 210, a parallel-to-serial converter 212, a scaling unit 215, an adder 220, a bit expansion unit 223, a bit modification unit 225, a trellis coded quantization unit 230, a modulation unit 235 and a subtraction unit 240. These system elements may be partitioned among one or more hardware devices (e.g., integrated circuits) in any of various ways. In some embodiments, the encoder system $S_{NE}$ is implemented as a single integrated circuit, e.g., as a DSP chip. In one embodiment, the encoder system $S_{NE}$ is implemented using the TI TMS320C6X DSP chip.

The IRA encoder 210 is configured to perform channel coding on a K-bit input message word m in order to generate an N-bit parity word p. N and K are positive integers. N is larger than K. (For example, in one embodiment, K=60,000 and N=240,000.)

The parallel-to-serial converter 212 may have N input lines (i.e., one input line for each of the N bit positions of the word p) and a single output line. The conversion unit 212 is configured to convert the N-bit parity word into a serial stream q of bits and to output the serial stream q onto the single output line. The parallel-to-serial converter may include a multiplexer and associated control logic.

The scaling unit 215 is configured to scale the channel state signal S to obtain a scaled signal. The scaled signal is denoted $\alpha S$, where a is the scaling factor. The scaling unit 215 may be implemented using a multiplier circuit. One input of the multiplier circuit may be supplied with the values of the scaled signal. The second input of the multiplier circuit may be supplied with the scale factor $\alpha$. The scale factor $\alpha$ may be programmable.

The adder 220 is configured to add the dither signal D to the scaled signal $\alpha S$ to generate the intermediate signal. The intermediate signal is denoted by the expression $\alpha S+D$.

The bit expansion unit 225 is configured to expand the parity stream q into the stream Q of A-bit words. Note the bit expansion unit 225 may be implemented simply as a branching system of conductive paths, e.g., as suggested in FIG. 11. (As used herein, the term "unit" does not necessarily imply implementation in terms of active circuitry.)

The bit modification unit 225 is configured to add the control streams $C_1, C_2, \ldots, C_L$ respectively to the L substreams of the stream Q. The additions may be performed in a "mod 2" fashion, e.g., using XOR gates.

The trellis coded quantization (TCQ) unit 230 is configured to generate the control streams $C_1, C_2, \ldots, C_L$ in response to the input vector b.

The modulation unit 235 is configured to perform the pulse amplitude modulation based on stream G in order to generate the modulated signal u. Alternative embodiments of the modulation unit 235 may implement other kinds of modulation.

The subtraction unit 240 is configured to subtract the intermediate signal from the modulated signal u to obtain the difference signal X.

In some embodiments, the encoder system $S_{NE}$ may include a transmitter or interface for transmitting the difference signal over a channel to a decoder system.

In some embodiments, the encoder system $S_{NE}$ may include circuitry configured to modulate an RF carrier using the difference signal X (as the modulating signal) in order to generate an RF output signal. The RF output signal may be transmitted over the channel.

In some embodiments, the encoder system $S_{NE}$ may include circuitry configured to add the difference signal X and the channel state signal S to obtain a resultant signal R. The resultant signal R may be transmitted to one or more destinations over one or more channels. Alternatively, the resultant signal may be stored in a memory medium for later retrieval. For example, the resultant signal may be stored in a memory medium associated with a server computer, and thus, made available to users of a computer network.

The input vector b, used to generate the control streams, will have been selected so that the difference signal X satisfies a power constraint. In some embodiments, the input vector b is selected so that the power associated with the difference signal X is minimized (or approximately minimized). The encoder system $S_{NE}$ may also include an optimization unit configured to perform an optimization (e.g., an optimization based on the Viterbi algorithm) to determine the input vector b.

Figure 4:
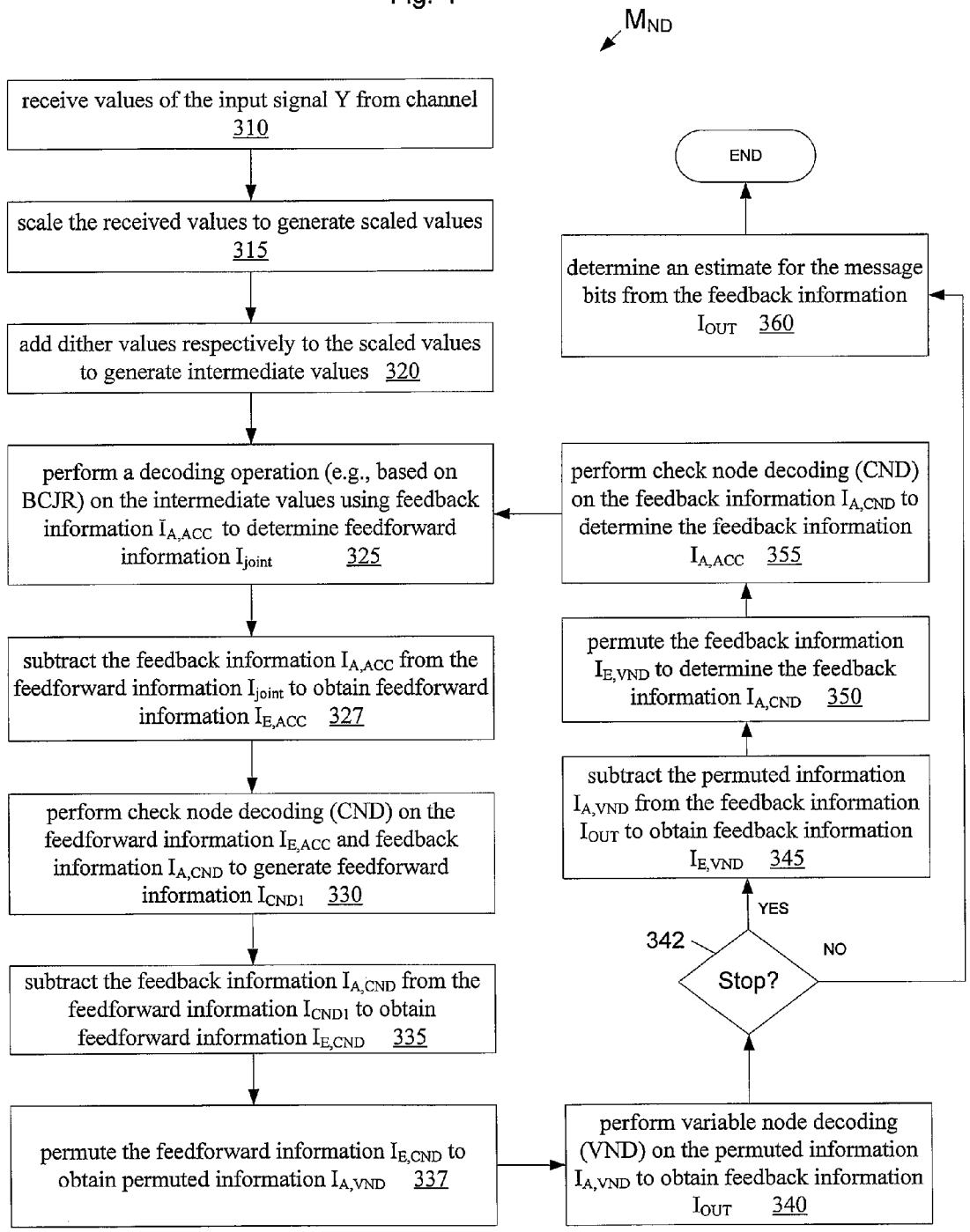
FIG. 4 illustrates one embodiment of an iterative method $M_{ND}$ for recovering message information from received signal information.

In one set of embodiments, a method $M_{ND}$ for recovering message bits from an input signal Y received from a channel may involve the following actions/operations as illustrated in FIG. 4. The method $M_{ND}$ may be performed by a processor (or a set of processors) which is configured to read program instructions from a memory and execute the program instructions. Thus, the method $M_{ND}$ may be encoded in the program instructions.

Figure 12:
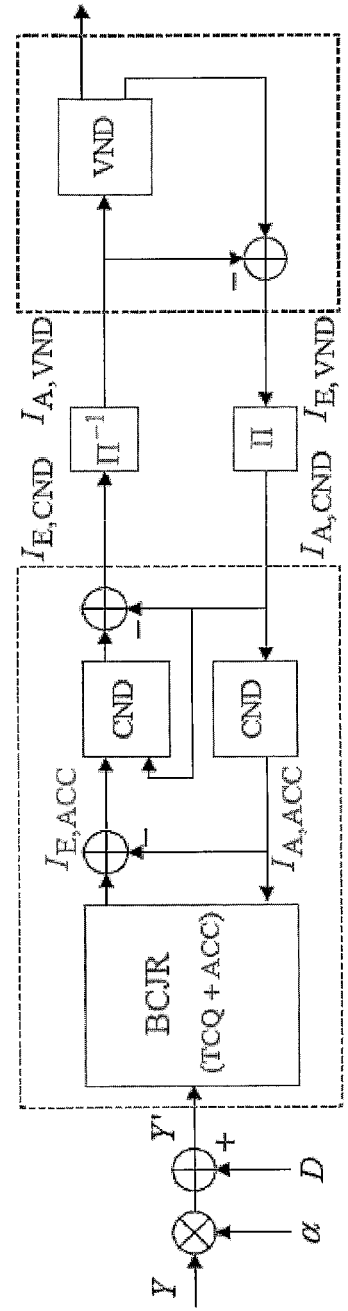
FIG. 12 is a block diagram of one embodiment of a decoder with TCQ and the non-systematic IRA code.

At 310, the processor receives a signal from the channel and operates on the received signal to recover values of the input signal Y. The input signal Y may be related to the signal X generated by the encoder system as shown in FIGS. 1 and 12, where S is the channel state signal as described above and Z is a noise signal.

At 315, the processor scales the values of the input signal Y to generate scaled values. The process of scaling may involve multiplying each of the input signal values by the scale factor α. The scale factor α may be the same as the scale factor used by the encoder system.

At 320, the processor adds dither values to the scaled values, respectively, in order to generate intermediate values. These dither values may be the same as the dither values used by the encoder system.

At 325, the processor performs a decoding operation (e.g., a BCJR-based decoding operation) on the intermediate values using feedback information $I_{A,ACC}$ in order to determine feedforward information $I_{joint}$. The decoding operation may be performed over a joint trellis corresponding to the trellis-coded quantization (TCQ), the accumulator portion (ACC) of the IRA encoder, and the bit modification unit (BMU) used by the encoder system. The decoding operation may rely on encoder structure information that represents the structure of each of TCQ, ACC and BMU. The information $I_{joint}$ may be LLR information over the joint trellis. Please refer to the section below entitled "TCQ Plus Non-Systematic IRA Code Design" for more description of the decoding operation. At 327, the processor subtracts the feedback information $I_{A,ACC}$ from the information $I_{joint}$ to obtain the feedforward information $I_{E,ACC}$.

At 330, the processor performs check node decoding (CND) on the feedforward information $I_{E,ACC}$ and feedback information $I_{A,CND}$ to generate feedforward information $I_{CND1}$ The check node decoding corresponds to the check nodes of the IRA encoder of the encoder system.

At 335, the processor subtracts the feedback information $I_{A,CND}$ from the information $I_{CND1}$ to obtain feedforward information $I_{E,CND}$.

At 337, the processor permutes the feedforward information $I_{E,CND}$ to obtain permuted information $I_{A,VND}$. The permutation that is applied to the feedforward information $I_{E,CND}$ may be the inverse of the permutation used by the IRA encoder of the encoder system.

At 340, the processor performs variable node decoding (VND) on the permuted information $I_{A,VND}$ to obtain information $I_{OUT}$. The variable node decoding corresponds to variable nodes of the IRA encoder of the encoder system.

At 345, the processor subtracts the permuted information $I_{A,VND}$ from the output information $I_{OUT}$ to obtain feedback information $I_{E,VND}$.

At 350, the processor permutes the feedback information $I_{E,VND}$ to determine the feedback information $I_{A,CND}$.

At 355, the processor performs check node decoding (CND) on the feedback information $I_{A,CND}$ to determine the feedback information $I_{A,ACC}$. The check node decoding corresponds to the check nodes of the IRA encoder of the encoder system.

The processor repeats operations 325 through 355 until a termination condition is achieved, as indicated at 342. For example, the processor may repeat until a predetermined number of repetitions are completed. As another example, the processor may repeat until the information $I_{OUT}$ (or the information $I_{E,VND}$) stabilizes. In one embodiment, the processor repeats until the size of $\Delta I_{OUT}$ (or the size of $\Delta I_{E,VND}$) remains small for a number of iterations. (The notation "$\Delta I_{OUT}$" denotes the change in $I_{OUT}$ relative to the previous iteration.) A wide variety of termination conditions are contemplated.

At 360, the processor determines estimates for the message bits from the output information $I_{OUT}$, e.g., by hard-limiting the values of the output information $I_{OUT}$ to binary values.

The decoding operation 325, the check node decoding operation 330, the variable node decoding operation 340 and the check node decoding operation 355 are soft-input soft-output (SISO) decoding operations. Thus, the information received and generated by these decoding operations is soft information, e.g., sets of log-likelihood ratios (LLRs).

Figure 5:
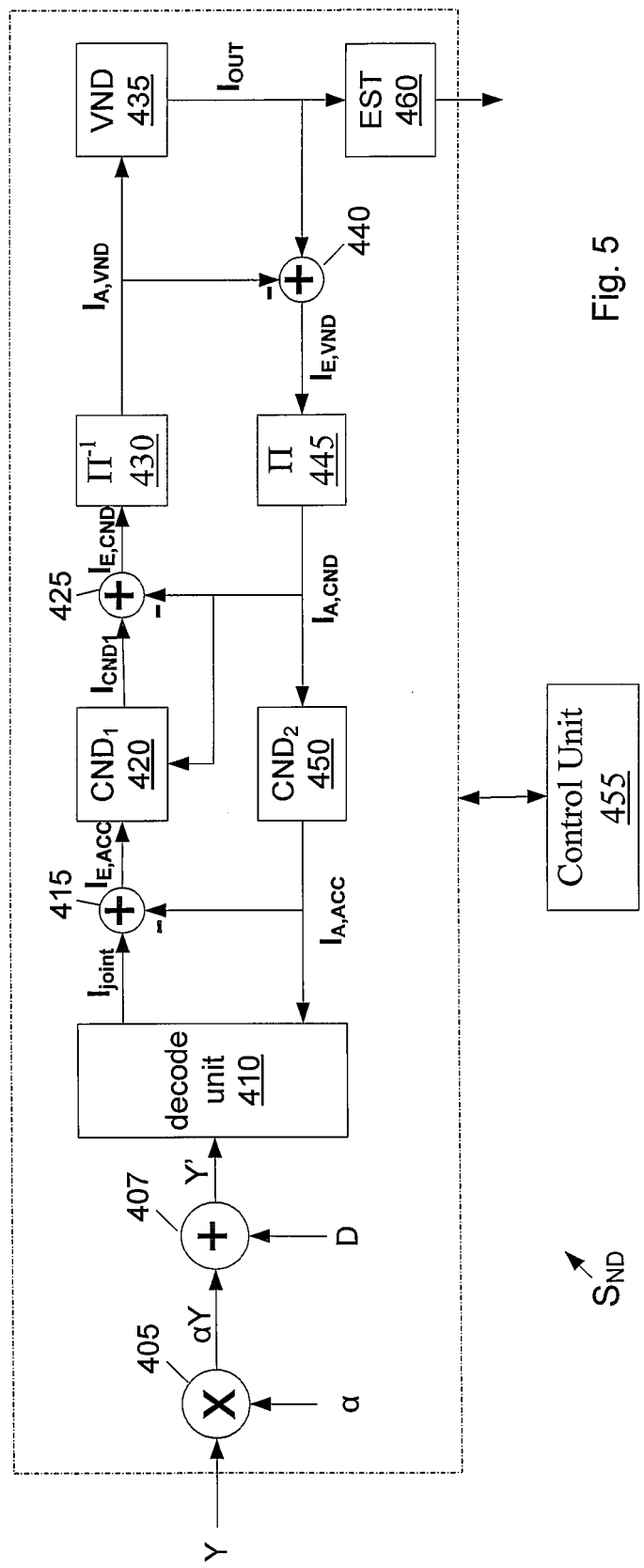
FIG. 5 illustrates one embodiment of a system $S_{ND}$ for recovering message information from received signal information.

In one set of embodiments, the processing operations of the method $M_{ND}$ described above and illustrated in FIG. 4 may be performed in a decoder system $S_{ND}$ including a set of analog and/or digital circuit units, e.g., as suggested in FIG. 5. The decoder system $S_{ND}$ may include a scaling unit 405, an adder 407, a decoder unit 410, a subtraction unit 415, a first check node decoder 420, a subtraction unit 425, an permutation unit 430, a variable node decoder 435, a subtraction unit 440, a permutation unit 445 and a second check node decoder 450. These system elements may be partitioned among one or more hardware devices (e.g., integrated circuits) in any of various ways. In some embodiments, the decoder system $S_{ND}$ is implemented as a single integrated circuit, e.g., as a DSP chip. In one embodiment, the encoder system $S_{ND}$ is implemented using the TI TMS320C6X DSP chip.

The scaling unit 405 is configured to receive the values of the input signal Y and to scale the input signal values by the scale factor α in order to obtain scaled values. The scaling unit 405 may be implemented using a multiplier (or a network of adders and multipliers).

The adder 407 is configured to add the dither values respectively to the scaled values to generate the intermediate values. One input of the adder 407 may be supplied with the scaled values from the scaling unit 405. The other input of the adder 407 may be supplied with the dither values. In FIG. 5, the dither value input is denoted as D. The dither values may be programmable.

The decoder unit 410 is configured to perform the decoding operation (e.g., a BCJR-based decoding operation) on the intermediate values using the feedback information $I_{A,ACC}$ in order to determine the feedforward information $I_{joint}$. The decoding operation may be performed over a joint trellis corresponding to the trellis-coded quantization (TCQ), the accumulator portion (ACC) of the IRA encoder, and the bit modification unit (BMU) used by the encoder system. The decoding operation may rely on encoder structure information that represents the structure of each of TCQ, ACC and BMU. The information $I_{joint}$ may be LLR information over the joint trellis. (LLR is an acronym for log likelihood ratio.) The encoder structure information may be programmable. Thus, the encoder structure information may be changed if and when necessary (e.g., by a host computer).

In one alternative embodiment, the decoder unit 410 is optimized assuming particular structures for TCQ, ACC and BMU. In this case, the encoder structure information may be designed into the circuitry of the decoder 410.

The subtraction unit 415 is configured to subtract the feedback information $I_{A,ACC}$ from the feedforward information $I_{joint}$ to obtain the feedforward information $I_{E,ACC}$.

The check node decoder 420 is configured to perform check node decoding on the feedforward information $I_{E,ACC}$ and the feedback information $I_{A,CND}$ to generate the feedforward information $I_{CND1}$.

The subtraction unit 425 is configured to subtract the feedback information $I_{A,CND}$ from the feedforward information $I_{CND1}$ to obtain the feedforward information $I_{E,CND}$.

The permutation unit 430 is configured to permute the feedforward information $I_{E,CND}$ to obtain the permuted information $I_{A,VND}$. The permutation that is applied by the permutation unit 430 may be the inverse of the permutation Π used by the IRA encoder of the encoder system.

The variable node decoder 435 is configured to perform the variable node decoding on the permuted information $I_{A,VND}$ to obtain the information $I_{OUT}$.

The subtraction unit 440 is configured to subtract the permuted information $I_{A,VND}$ from the information $I_{OUT}$ to obtain the feedback information $I_{E,VND}$.

The permutation unit 445 is configured to permute the feedback information $I_{E,VND}$ to determine the feedback information $I_{A,CND}$. The permutation applied by the permutation unit 445 may be the same as the permutation Π used by the IRA encoder of the encoder system.

The check node decoder 450 is configured to perform check node decoding on the feedback information $I_{A,CND}$ to determine the feedback information $I_{A,ACC}$.

The decoder system may also include a control unit 455 that controls iterations of the operations 325 through 355 by the units 410 through 450. The control unit may continue the iterations until a termination condition is achieved. Any of various termination conditions may be used, e.g., as discussed above.

In one embodiment, the decoder system $S_{ND}$ operates in a pipelined fashion.

After the termination condition has been achieved, the estimation unit 460 is configured to determine estimates for the original message bits (that were generated by the information source) from the information $I_{OUT}$.

Figure 6:
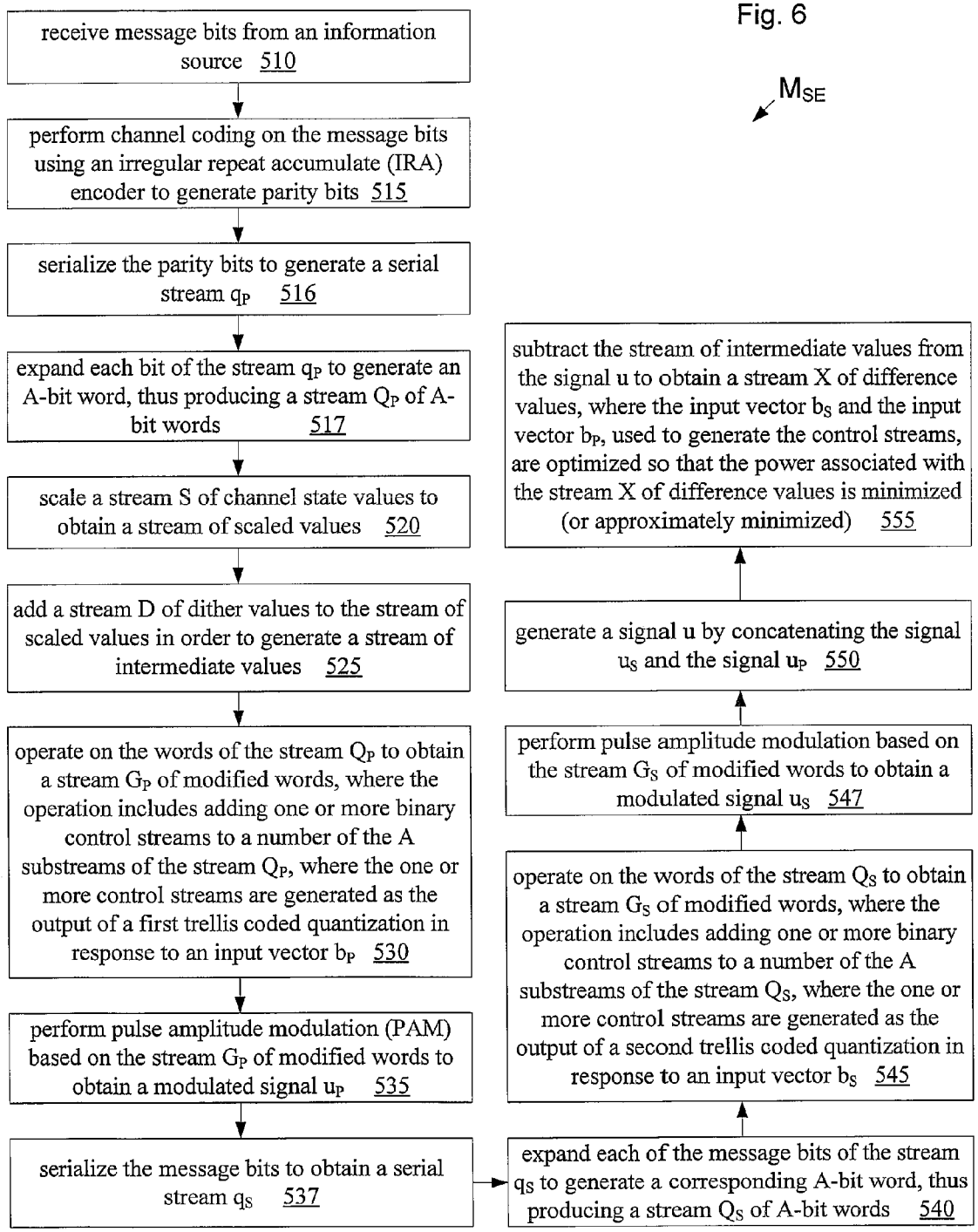
FIG. 6 illustrates one embodiment of a method $M_{SE}$ for encoding message information that involves both a systematic portion and a parity portion.

In one set of embodiments, a method $M_{SE}$ for encoding data may involve the following actions/operations as illustrated in FIG. 6. The method $M_{SE}$ may be performed by a processor (or a set of processors) which is configured to read program instructions from a memory and execute the program instructions. In method $M_{SE}$, operations 510 through 535 (to be described below) are similar respectively to operations 110 through 135 of method $M_{NE}$ described above.

At 510, the processor receives message bits (e.g., in the form of a K-bit word, where K is a positive integer) from an information source.

At 515, the processor performs channel coding on the message bits using an irregular repeat accumulate (IRA) encoder in order to generate parity bits. Please refer to the section below entitled "TCQ Plus Systematic IRA Code Design" for information on how to design at least one embodiment of the IRA encoder.

At 516, the processor serializes the parity bits generated by the IRA encoder in order to generate a serial stream $q_P$.

At 517, the processor expands each bit of the stream $q_P$ to generate a corresponding A-bit word as described above, where A is an integer greater than one. (For example, in one embodiment, A=4.) The stream of words is denoted $Q_P$.

At 520, the processor scales the channel state signal S by the scale factor α to obtain the scaled signal αS.

At 525, the processor adds the dither signal D to the scaled signal αS in order to generate the intermediate signal (denoted αS+D).

At 530, the processor operates on the words of the stream $Q_P$ to obtain a stream $G_P$ of modified words. This operation may include adding binary control streams $CP_1, CP_2, \ldots, CP_L$ respectively to L of the A substreams of the stream $Q_P$. (L is a positive integer. For example, in the embodiment of FIG. 16, L equals two.) The control streams $CP_1, CP_2, \ldots, CP_L$ may be generated as the output of a first trellis coded quantization ($TCQ_1$) in response to an input vector $b_P$ whose components are binary values. The first trellis coded quantization may be designed as described in the section below entitled "TCQ Plus Systematic IRA Code Design".

At 535, the processor performs pulse amplitude modulation (PAM) on the stream $G_P$ of modified words to obtain a modulated signal $u_P$ having a finite number of amplitude states. (The PAM may be $2^A$-state PAM. For example, in one embodiment, A equals 4.) In alternative embodiments, other types of modulation may be used.

At 537, the processor serializes the message bits to obtain a serial stream $q_P$.

At 540, the processor expands each of the message bits to generate a corresponding A-bit word. (For example, in one embodiment, A=4.) The stream of words is denoted $Q_S$.

At 545, the processor operates on the words of the stream $Q_S$ to obtain a stream $G_S$ of modified words. This operation may include adding binary control streams $CS_1, CS_2, \ldots, CS_L$ respectively to L of the A substreams of the stream $Q_S$. (In the embodiment of FIG. 16, L equals two.) The control streams $CS_1, CS_2, \ldots, CS_L$ may be generated as the output of a second trellis coded quantization in response to an input vector $b_S$ whose components are binary values. The second trellis coded quantization (TCQ) may be designed as described in the section below entitled "TCQ Plus Systematic IRA Code Design".

At 547, the processor performs pulse amplitude modulation based on the stream $G_S$ of modified words to obtain a modulated signal $u_S$ having a finite number of states. (The PAM may be $2^A$-state PAM. For example, in one embodiment, A equals 4.) In alternative embodiments, other types of modulation may be used.

At 550, the processor generates a signal u by concatenating the samples of the modulated signal $u_S$ with the samples of the modulated signal $u_P$.

At 555, the processor subtracts the intermediate signal (αS+D) from the signal u to obtain a difference signal X.

In some embodiments, the difference signal X may be transmitted over a channel to a decoder system.

In some embodiments, the difference signal X may be used to modulate an RF carrier in order to generate an RF output signal. The RF output signal may be transmitted over the channel.

In some embodiments, the difference signal X may be added to the channel state signal S to obtain a resultant signal R. The resultant signal R may be transmitted to one or more destinations over one or more channels. Alternatively, the resultant signal may be stored in a memory medium for later retrieval. For example, the resultant signal may be stored in the memory of a server computer, and thus, made available to users of a computer network.

The input vectors $b_P$ and $b_S$, used to generate the control streams, will have been selected so that the difference signal X satisfies a power constraint. In some embodiments, the input vector b is selected so that the power associated with the difference signal X is minimized (or approximately minimized). The processor may perform an optimization (or optimizations) based on the Viterbi algorithm to determine the input vectors $b_P$ and $b_S$.

Figure 7:
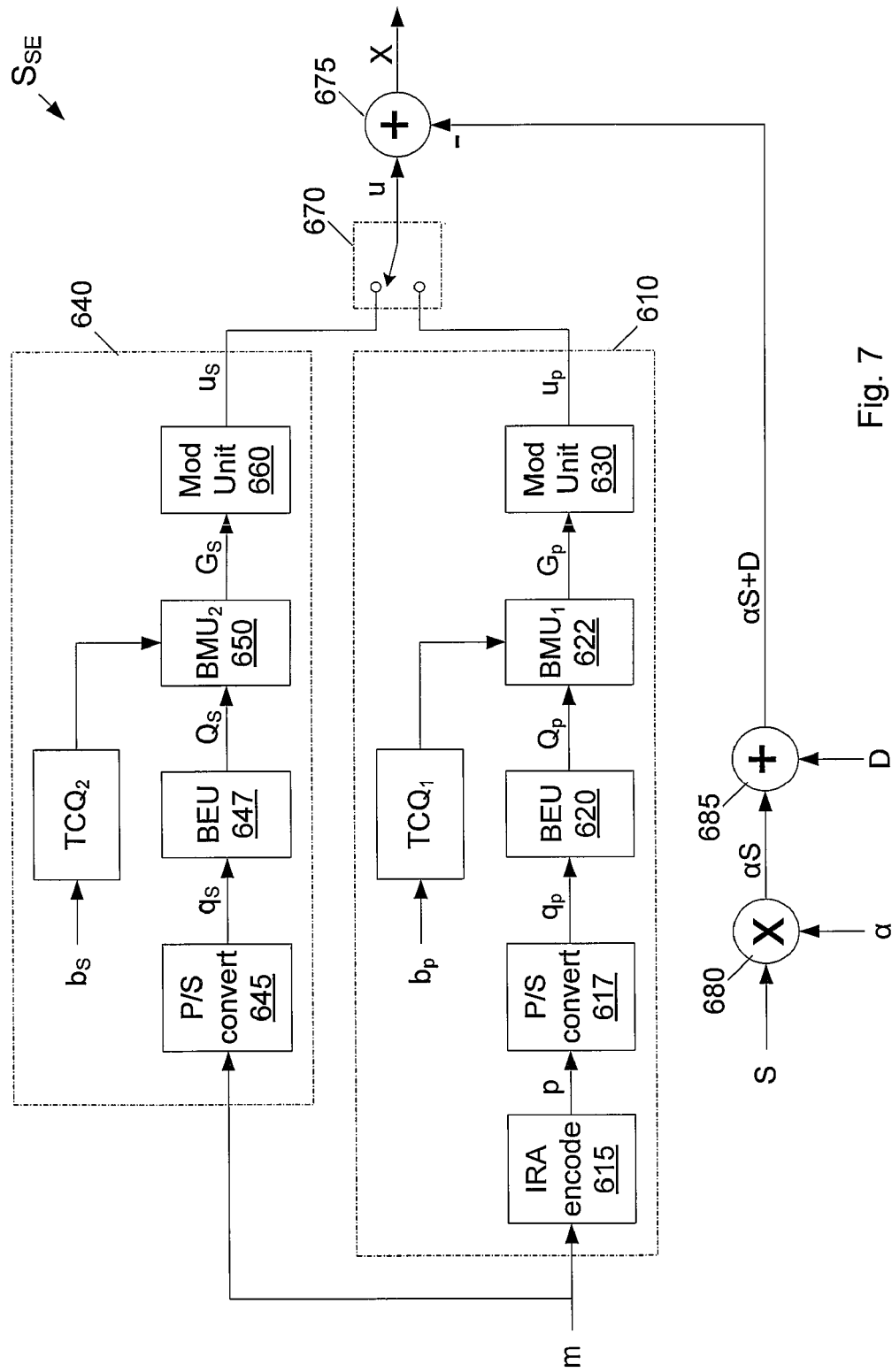
FIG. 7 illustrates one embodiment of a system $S_{SE}$ for encoding message information that involves both a systematic portion and a parity portion.

In one set of embodiments, the processing operations of the method $M_{SE}$ described above and illustrated in FIG. 6 may be performed in an encoder system $S_{SE}$ including a set of analog and/or digital circuit units as suggested in FIG. 7. The encoder system $S_{SE}$ may include a parity portion 610, a systematic portion 640, a switching unit 670, a subtraction unit 675, a scaling unit 680 and an adder 685.

The parity portion 610 may include an IRA encoder 615, a parallel-to-serial converter 617, a bit expansion unit 620, a bit modification unit 622, a trellis coded quantization unit 625 and a modulation unit 630. The systematic portion 640 may include a parallel-to-serial converter 645, a bit expansion unit 647, a bit modification unit 650, a trellis coded quantization unit 655 and a modulation unit 660.

The elements of encoder system $S_{SE}$ may be partitioned among one or more hardware devices (e.g., integrated circuits) in any of various ways. In some embodiments, the encoder system $S_{SE}$ is implemented as a single integrated circuit, e.g., as a DSP chip. In one embodiment, the encoder system $S_{SE}$ is implemented using the TI TMS320C6X DSP chip.

The IRA encoder 615 is configured to perform channel coding on the K-bit input message word m in order to generate the N-bit parity word p. N and K are positive integers. N is larger than K. (For example, in one embodiment, K=60,000 and N=180,000.)

The parallel-to-serial converter 617 may have N input lines (i.e., one input line for each of the N bit positions of the word p) and a single output line. The converter 617 may be configured to convert the N-bit parity word p into a serial stream $q_P$ of bits and output the serial stream $q_P$ onto the single output line.

The bit expansion unit 620 is configured to expand the parity stream $q_P$ into the stream $Q_P$ of A-bit words. Note the bit expansion unit 225 may be implemented simply as a branching system of conductive paths, e.g., as suggested in FIG. 16.

The bit modification unit 622 ($BMU_1$) is configured to add the control streams $CP_1, CP_2, \ldots, CP_L$ respectively to the L substreams of the stream $Q_P$ to obtain the stream $G_P$ of modified words. The additions may be performed in a "mod 2" fashion, e.g., using XOR gates.

The TCQ unit 625 is configured to generate the control streams $CP_1, CP_2, \ldots, CP_L$ in response to the input vector $b_P$.

The modulation unit 630 is configured to perform pulse amplitude modulation based on the stream $G_P$ in order to generate the modulated signal $u_P$. Alternative embodiments of the modulation unit 235 may implement other kinds of modulation.

The parallel-to-serial converter 645 may have K input lines (i.e., one input line for each of the K bit positions of the input message word m) and a single output line. The converter 645 is configured to convert the K-bit input message word m into a serial stream $q_S$ of bits and output the serial stream $q_S$ onto the single output line.

The bit expansion unit 647 is configured to expand the parity stream $q_S$ into the stream $Q_S$ of A-bit words. The bit expansion unit 647 may be implemented simply as a branching system of conductive paths, e.g., as suggested in FIG. 16.

The bit modification unit 650 ($BMU_2$) is configured to add control streams $CS_1, CS_2, \ldots, CS_L$ respectively to L substreams of the stream $Q_S$ to obtain the stream $G_S$ of modified words.

The TCQ unit 655 is configured to generate the control streams $CS_1, CS_2, \ldots, CS_L$ in response to the input vector $b_S$. In one embodiment, the TCQ unit 655 is designed according to the method described in the section below entitled "TCQ Plus Systematic IRA Code Design".

The modulation unit 660 is configured to perform pulse amplitude modulation based on the stream $G_S$ in order to generate the modulated signal $u_S$. Alternative embodiments of the modulation unit 235 may implement other kinds of modulation.

The scaling unit 680 is configured to scale the channel state signal S to obtain the scaled signal αS. The scale factor α may be programmable.

The adder 685 is configured to add the dither signal D to the scaled signal αS to generate the intermediate signal αS+D. The values of the dither signal may be programmable.

The switch unit 670 is configured to generate the signal u by combining (e.g., concatenating) the values of the modulated signal $u_S$ and the values of the modulated signal $u_P$.

The subtraction unit 675 is configured to subtract the intermediate signal αS+D from the signal u to obtain the difference signal X.

In some embodiments, the encoder system $S_{SE}$ may include a transmitter or interface for transmitting the difference signal X over a channel to a decoder system.

In some embodiments, the encoder system $S_{SE}$ may include circuitry configured to modulate an RF (radio frequency) carrier using the difference signal X as the modulating signal in order to generate an RF output signal. The RF output signal may be transmitted over the channel.

In some embodiments, the encoder system $S_{SE}$ may include circuitry configured to add the difference signal X and the channel state signal S to obtain a resultant signal R. The resultant signal R may be transmitted to one or more destinations over one or more channels. Alternatively, the resultant signal may be stored in a memory medium for later retrieval. For example, the resultant signal may be stored in a memory medium associated with a server computer, and thus, made available to users of a computer network.

The input vectors $b_P$ and $b_S$, used to generate the control streams, will have been selected so that the difference signal X satisfies a power constraint. In some embodiments, the input vector b is selected so that the power associated with the difference signal X is minimized (or approximately minimized). The encoder system may also include an optimization unit configure to perform an optimization (e.g., an optimization based on the Viterbi algorithm) to determine the input vectors $b_P$ and $b_S$.

Figure 8:
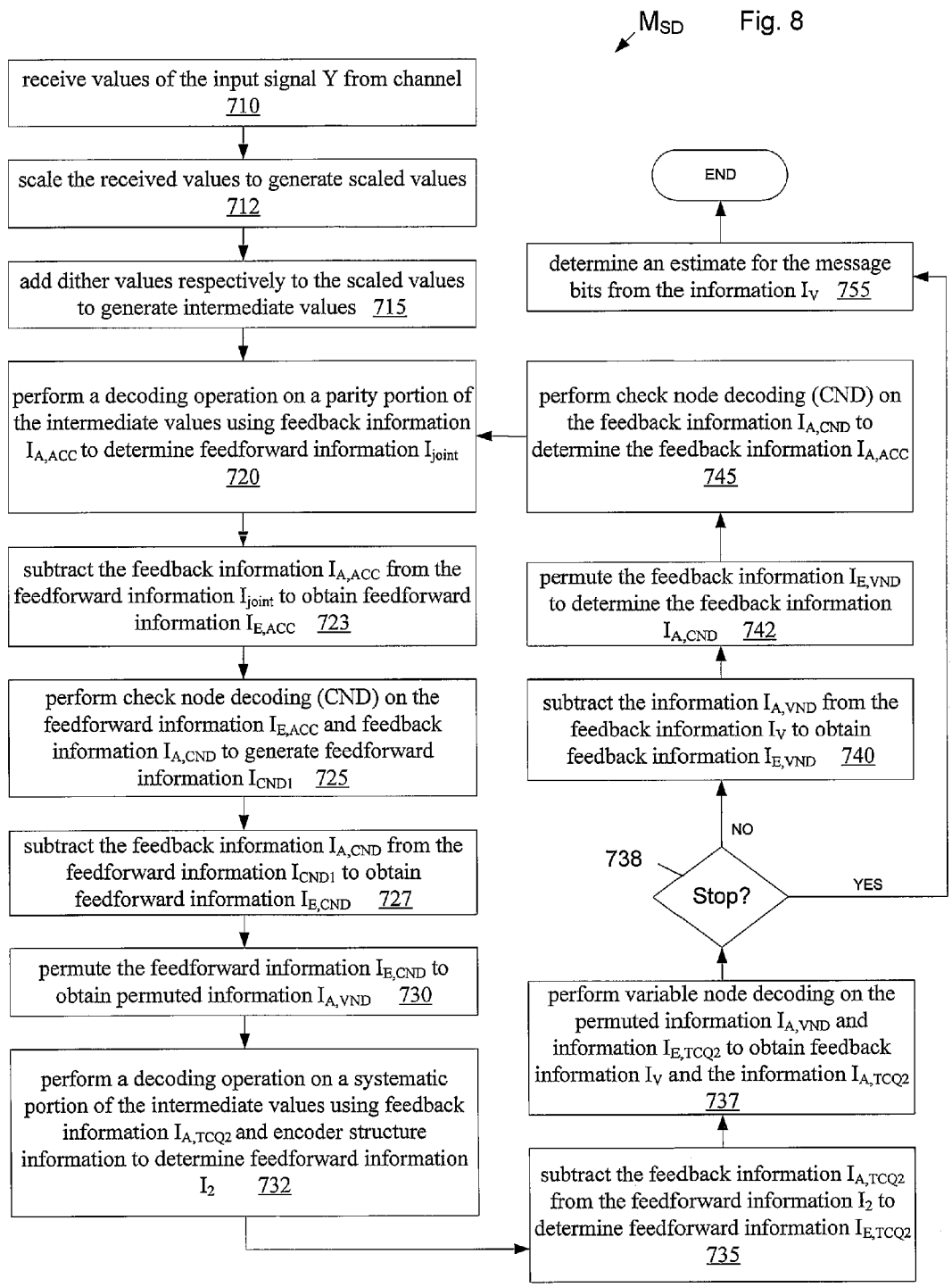
FIG. 8 illustrates one embodiment of a method $M_{SD}$ for recovering message information from received signal information that involves both a systematic portion and a parity portion.

In one set of embodiments, a method $M_{SD}$ for recovering message bits from an input signal Y may involve the following actions/operations as illustrated in FIG. 8. The method $M_{SD}$ may be performed by a processor (or a set of processors) which is configured to read program instructions from a memory and execute the program instructions. Thus, the method $M_{SD}$ may be encoded in the program instructions.

Figure 17:
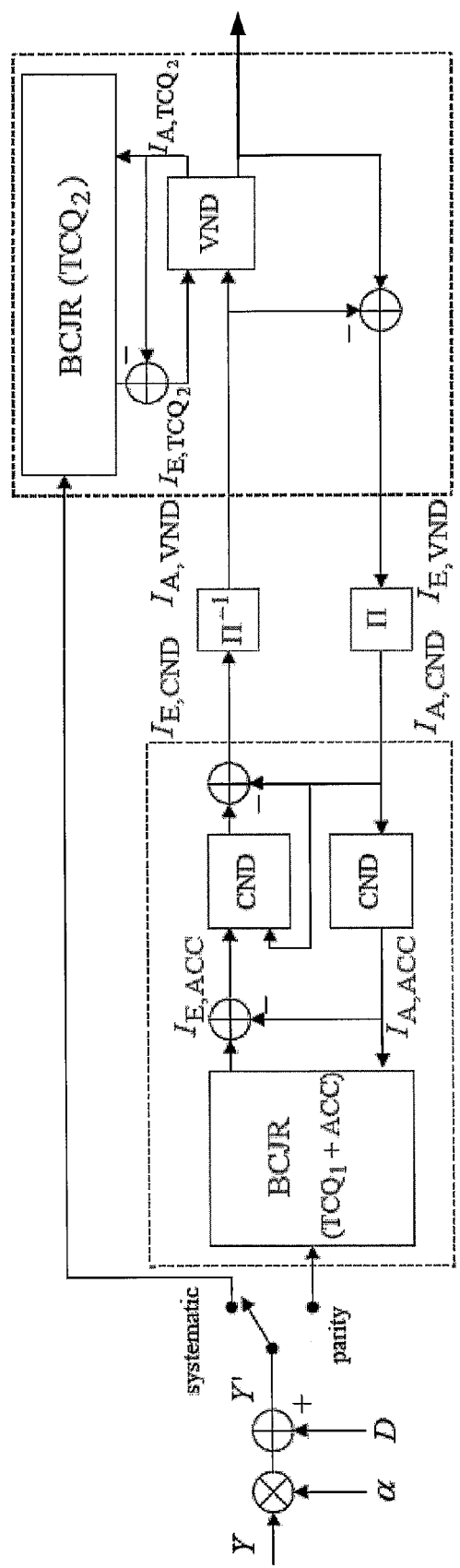
FIG. 17 is a block diagram of one embodiment of a decoder with TCQ and the systematic IRA code.

At 710, the processor receives values of the input signal Y. The input signal Y may be related to the signal X generated by an encoder system as shown in FIGS. 1 and 17, where S is the channel state signal as described above and Z is a noise signal. The encoder system may be a system configured to implement the method $M_{SE}$, e.g., the encoder system $S_{SE}$ of FIG. 7.

At 712, the processor scales the values of input signal Y to generate scaled values. The process of scaling may involve multiplying each of the input signal values by the scale factor α. The scale factor α may be the same as the scale factor used by the encoder system.

At 715, the processor adds dither values respectively to the scaled values to generate intermediate values Y'. These dither values may be the same as the dither values used by the encoder system.

At 720, the processor performs a decoding operation (e.g., a BCJR-based decoding operation) on a parity portion $Y_P'$ of the intermediate values Y' using feedback information $I_{A,ACC}$ to determine feedforward information $I_{joint}$. The decoding operation may be performed over a joint trellis corresponding to the first trellis-coded quantization ($TCQ_1$), the accumulator portion (ACC) of the IRA encoder, and the bit modification unit ($BMU_1$) used by the parity portion of the encoder system. The decoding operation may rely on encoder structure information that represents the structure of each of $TCQ_1$, ACC and $BMU_1$. The information $I_{joint}$ may be LLR information over the joint trellis.

At 723, the processor subtracts the feedback information $I_{A,ACC}$ from the information $I_{joint}$ to obtain feedforward information $I_{E,ACC}$.

At 725, the processor performs check node decoding on the feedforward information $I_{E,ACC}$ and feedback information $I_{A,CND}$ to generate feedforward information $I_{CND1}$. The check node decoding corresponds to the check nodes of the IRA encoder of the encoder system.

At 727, the processor subtracts the feedback information $I_{A,CND}$ from the information $I_{CND1}$ to obtain the feedforward information $I_{E,CND}$.

At 730, the processor permutes the feedforward information $I_{E,CND}$ to obtain permuted information $I_{A,VND}$. The permutation that is applied to the feedforward information $I_{E,CND}$ may be the inverse of the permutation used by the IRA encoder of the encoder system.

At 732, the processor performs a decoding operation (e.g., a BCJR-based decoding operation) on a systematic portion $Y_S'$ of the intermediate values Y' using feedback information $I_{A,TCQ2}$ provided by the decoder 825 to determine feedforward information $I_2$. The decoding operation may be performed over a trellis corresponding to the second trellis-coded quantization ($TCQ_2$) and the bit modification unit ($BMU_2$) used by the systematic portion of the encoder system. The decoding operation may rely on encoder structure information that represents the structure of each of $TCQ_2$ and $BMU_2$. The information $I_2$ may be LLR information over the trellis.

At 735, the processor subtracts the feedback information $I_{A,TCQ2}$ from the information $I_2$ to determine feedforward information $I_{E,TCQ2}$.

At 737, the processor performs variable node decoding on the permuted information $I_{A,VND}$ and the feedback information $I_{E,TCQ2}$ to obtain feedback information $I_V$ and information $I_{A,TCQ2}$. The variable node decoding corresponds to the variable nodes of the IRA encoder of the encoder system.

At 740, the processor subtracts the permuted information $I_{A,VND}$ from the information $I_V$ to obtain feedback information $I_{E,VND}$.

At 742, the processor permutes the feedback information $I_{E,VND}$ to determine the feedback information $I_{A,CND}$. The permutation matrix used here may be the same permutation matrix used by the IRA encoder of the encoder system.

At 745, the processor performs check node decoding on the feedback information $I_{A,CND}$ to determine the feedback information $I_{A,ACC}$. The check node decoding corresponds to the check nodes of the IRA encoder of the encoder system.

The processor repeats operations 720 through 745 until a termination condition is achieved. For example, the processor may repeat until a predetermined number of repetitions are completed. As another example, the processor may repeat until the information $I_V$ (or the information $I_{E,VND}$) stabilizes. In one embodiment, the processor repeats until the size of $\Delta I_V$ (or the size of $\Delta I_{E,VND}$) remains small for a number of iterations. A wide variety of termination conditions are contemplated.

The test to determine if the termination condition is achieved may be performed after operation 737, e.g., as indicated at 738. If the termination condition is not achieved, the processor may continue with operation 740. If the termination condition is achieved, the processor may perform operation 755.

At 755, the processor determines an estimate for the message bits from the information $I_V$, e.g., by performing hard-limiting on the information $I_V$.

In some embodiments, the iterative decoding operations 720 and 732, the check node decoding operations 725 and 745, and the variable node decoding operation 737 are soft-input soft-output (SISO) decoding operations. Thus, the information received and the information generated by these decoding operations may be soft information, e.g., sets of log-likelihood ratios (LLRs).

Figure 9:
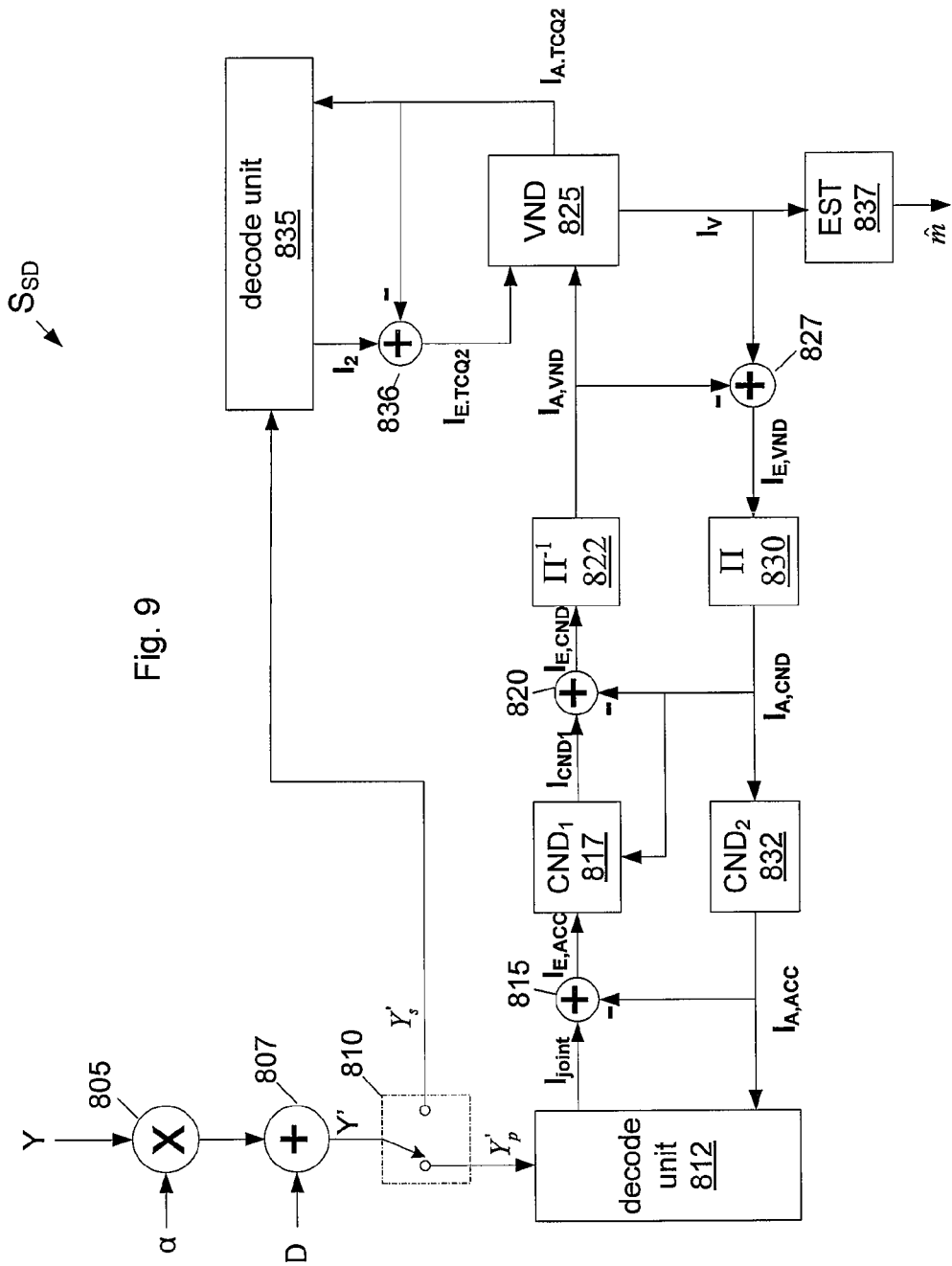
FIG. 9 illustrates one embodiment of a system $S_{SD}$ for recovering message information from received signal information that involves both a systematic portion and a parity portion.

In one set of embodiments, the processing operations of the method $M_{SD}$ described above and illustrated in FIG. 8 may be performed in a decoder system $S_{SD}$ including a set of analog and/or digital circuit units, e.g., as suggested in FIG. 9. The decoder system $S_{SD}$ may include a scaling unit 805, an adder 807, a distribution unit 810, a decoder unit 812, a subtraction unit 815, a first check node decoder 817, a subtraction unit 820, an permutation unit 822, a variable node decoder 825, a subtraction unit 827, a permutation unit 830, a second check node decoder 832, a subtraction unit 836, a decode unit 835 and an estimation unit 837. The elements of decoder system $S_{SD}$ may be partitioned among one or more hardware devices (e.g., integrated circuits) in any of various ways. In some embodiments, the decoder system $S_{SD}$ is implemented as a single integrated circuit, e.g., as a DSP chip. In one embodiment, the decoder system $S_{SD}$ is implemented using the TI TMS320C6X DSP chip.

The scaling unit 805 is configured to receive the values of the input signal Y from the channel and to scale the input signal values by the scale factor α in order to generate scaled values.

The adder 807 is configured to add the dither values D respectively to the scaled values to obtain intermediate values Y'. The dither values may be programmable.

The distribution unit 810 is configured to distribute a parity portion of the intermediate values to the decode unit 812 and a systematic portion of the intermediate values to the decode unit 835.

The decoder unit 812 is configured to perform the decoding operation (e.g., a BCJR-based decoding operation) on a parity portion $Y_P'$ of the intermediate values Y' using the feedback information $I_{A,ACC}$ to determine the feedforward information $I_{joint}$. The decoding operation may be performed over a joint trellis corresponding to the first trellis-coded quantization ($TCQ_1$), the accumulator portion (ACC) of the IRA encoder, and the bit modification unit ($BMU_1$) used by the parity portion of the encoder system. The decoding operation may rely on encoder structure information that represents the structure of each of $TCQ_1$, ACC and $BMU_1$. The information $I_{joint}$ may be LLR information over the joint trellis.

The encoder structure information may be programmable. Thus, the encoder structure information may be changed if and when necessary (e.g., by a host computer).

In one alternative embodiment, the decoder unit 812 is optimized assuming particular structures for $TCQ_1$, ACC and $BMU_1$. In this case, the encoder structure information may be designed into the circuitry of the decoder 812.

The subtraction unit 815 is configured to subtract the feedback information $I_{A,ACC}$ from the information $I_{joint}$ to obtain the feedforward information $I_{E,ACC}$.

The first check node decoder 817 is configured to perform the check node decoding on the feedforward information $I_{E,ACC}$ and the feedback information $I_{A,CND}$ to generate the feedforward information $I_{CND1}$.

The subtraction unit 820 is configured to subtract the feedback information $I_{A,CND}$ from the information $I_{CND1}$ to obtain the feedforward information $I_{E,CND}$.

The permutation unit 822 is configured to permute the feedforward information $I_{E,CND}$ to obtain the permuted information $I_{A,VND}$. The permutation that is applied by the permutation unit 822 may be the inverse of the permutation Π used by the IRA encoder of the encoder system.

The decode unit 835 is configured to perform a decoding operation (e.g., a BCJR-based decoding operation) on the systematic portion $Y_S'$ of the intermediate values Y' using the feedback information $I_{A,TCQ2}$ to determine feedforward information $I_2$. The decoding operation may be performed over a trellis corresponding to the second trellis-coded quantization ($TCQ_2$) and the bit modification unit ($BMU_2$) used by the systematic portion of the encoder system. The decoding operation may rely on encoder structure information that represents the structure of each of $TCQ_2$ and $BMU_2$.

In one alternative embodiment, the decoder unit 835 is optimized assuming particular structures for $TCQ_2$ and $BMU_2$. In this case, the encoder structure information may be designed into the circuitry of the decoder 835.

The subtraction unit 836 is configured to subtract the feedback information $I_{A,TCQ2}$ from the feedforward information $I_2$ to obtain the feedforward information $I_{E,TCQ2}$.

The variable node decoder 825 is configured to perform the variable node decoding using the permuted information $I_{A,VND}$ and the feedforward information $I_{E,TCQ2}$ to obtain the feedback information $I_V$ and information $I_{A,TCQ2}$.

The subtraction unit 827 is configured to subtract the information $I_{A,VND}$ from the information $I_V$ to obtain the feedback information $I_{E,VND}$.

The permutation unit 830 is configured to permute the feedback information $I_{E,VND}$ to determine the feedback information $I_{A,CND}$. The permutation applied by the permutation unit 830 may be the same as the permutation Π used by the IRA encoder of the encoder system.

The second check node decoder 832 is configured to perform check node decoding on the feedback information $I_{A,CND}$ to determine the feedback information $I_{A,ACC}$.

The decoder system may also include a control unit (not shown) that controls each iteration of the operations 720 through 745 by the units 805 through 832. The control unit may continue the iterations until a termination condition is achieved. Any of various termination conditions may be used, e.g., as discussed above.

In one embodiment, the decoder system operates in a pipelined fashion.

The estimation unit 837 is configured to determine estimates for the original message bits (that were generated by the information source) from the information $I_V$, after the termination condition has been achieved.

In one set of embodiments, a method for encoding data may involve: performing IRA-based channel coding on a set of message bits in order to generate a stream of expanded parity words; and performing source coding on the stream of expanded parity words to generate a modulated signal, where said performing source coding includes modifying the expanded parity words using output from a trellis coded quantization; where the modulated signal is usable, in conjunction with a channel state signal, to generate an output signal X.

The output from the trellis-coded quantization is generated in response to an input vector b supplied to the trellis-coded quantization. The input vector b will have been selected so that the output signal X satisfies a power constraint. The action of performing source coding may also include performing pulse amplitude modulation based on the modified expanded parity words to obtain the modulated signal. The output signal X may be generated by subtracting a scaled and dithered version of the channel state signal from the modulated signal.

The output signal may be transmitted over a channel to one or more destinations. Any of various types of channel are contemplated.

Alternatively, the output signal may be stored in a memory medium, e.g., in a memory medium associated with a computer system. The stored output signal may be made available to one or more information consumers.

In another set of embodiments, a method for recovering message bits from an input signal may involve: inner decoding an input signal in order to generate first feedforward information, where the inner decoding includes (a) performing trellis decoding on the input signal over a joint trellis corresponding at least to an accumulator portion of an irregular repeat accumulate (IRA) encoder and a trellis coded quantization and (b) performing first check node decoding on data including a modified version of output from the trellis decoding, where the first feedforward information is a modified version of output from the first check node decoding; and outer decoding a permuted version of the first feedforward information in order to generate first feedback information, where said outer decoding includes performing variable node decoding, corresponding to variable nodes of the IRA encoder, on the permuted version of the first feedforward information, where the first feedback information is a modified version of output from the variable node decoding; where the output of the variable node decoding is usable to determine an estimate for the message bits.

The input signal is a scaled and dithered version of a received signal. The action of inner decoding may also include performing second check node decoding on a permuted version of the first feedback information. The trellis decoding may use the output from the second check node decoding. An estimate for the message bits may be determined from the output of the variable node decoding.

The estimate for the message bits may be stored in a memory medium, e.g., in a memory medium associated with a computer system. One or more information consumers may access the estimate from the memory medium.

In yet another set of embodiments, a method for encoding data may involve: performing IRA-based channel coding on message bits in order to generate a stream of expanded parity words; performing first source coding on the stream of expanded parity words to generate a first modulated signal, where said performing first source coding includes modifying the expanded parity words using output from a first trellis coded quantization; expanding the message bits to obtain expanded message words; performing second source coding on the stream of expanded message words to generate a second modulated signal, where said performing second source coding includes modifying the expanded message words using output from a second trellis coded quantization; and generating a signal u from the first modulated signal and the second modulated signal, where the signal u is usable, in conjunction with a channel state signal, to generate an output signal X.

The output from the first trellis-coded quantization is generated in response to an input vector $b_P$ supplied to the first trellis-coded quantization. The output from the second trellis-coded quantization is generated in response to an input vector $b_S$ supplied to the second trellis-coded quantization. The input vectors $b_P$ and $b_S$ will have been selected so that the output signal X satisfies a power constraint.

The action of performing the first source coding may also include performing pulse amplitude modulation based on the modified expanded parity words to obtain the first modulated signal. The action of performing the second source coding may also include performing pulse amplitude modulation based on the modified expanded message words to obtain the second modulated signal.

The output signal X may be generated by subtracting a scaled and dithered version of the channel state signal from the signal u.

The output signal X may be transmitted over a channel to one or more destinations. Any of various types of channel are contemplated.

Alternatively, the output signal X may be stored in a memory medium, e.g., in a memory medium associated with a computer system. The stored output signal may be made available to one or more information consumers.

In yet another set of embodiments, a method for recovering message bits from an input signal may involve: performing first decoding operations on a parity portion of the input signal in order to generate first feedforward information, where said performing first decoding operations includes (a) performing a first trellis decoding on the parity portion over a joint trellis corresponding at least to an accumulator portion of an irregular repeat accumulate (IRA) encoder and a first trellis coded quantization and (b) performing first check node decoding on data including a modified version of output from the first trellis decoding, where the first feedforward information is a modified version of output from the first check node decoding; performing second decoding operations on a systematic portion of the input signal and a permuted version of the first feedforward information in order to generate first feedback information and second feedback information, where said performing second decoding operations includes (c) performing a second trellis decoding on the systematic portion over a trellis corresponding to a second trellis coded quantization and (d) performing variable node decoding on the permuted version of the first feedforward information and a modified version of output from the second trellis decoding, where the first feedback information and the second feedback information are outputs of the variable node decoding; where the second feedback information is usable to determine an estimate for the message bits. The second trellis decoding may use the first feedback information.

The input signal is a scaled and dithered version of a received signal. The action of performing the second decoding operations may also include subtracting the permuted version of the first feedforward information from the second feedback information to obtain third feedback information. The action of performing the first decoding operations may also include performing second check node decoding on a permuted version of the third feedback information, where the first trellis decoding uses output from the second check node decoding.

The estimate for the message bits may be determined from the second feedback information, e.g., by hard-limiting the second feedback information.

In some embodiments, a computer-readable memory medium may be configured to store program instructions, where the program instructions are executable to implement any of the method embodiments described herein (or, any combination of the method embodiments described herein, or, any $sub_S$ et of the method embodiments described herein). A memory medium is a medium configured for the storage of information. Examples of memory media include various kinds of magnetic media (e.g., magnetic tape, magnetic disk, magnetic strips, and magnetic film); various kinds of optical media (e.g., CD-ROM); various kinds of semiconductor RAM and ROM; various media based on the storage of electrical charge and/or other physical quantities; etc.

In some embodiments, a computer system may be configured to include a processor and memory medium. The memory medium may be configured to store program instructions. The processor may be configured to read and execute the program instructions. The program instructions may be executable to implement any of the various method embodiments described herein (or, any combination of the method embodiments described herein, or, any subset of the method embodiments described herein). The computer system may be realized in any of various forms. For example, the computer system may be a personal computer (in any of its various forms), a workstation, a computer on a card, a server computer, a client computer, a computer system in a sensor device, etc.

In one application scenario, the encoder system and method embodiments described herein may be used to impress desired information (e.g., message information) on an image in a manner that is not apparent to viewers of the image. In this case, the channel state information S is the original image, and the message bits define the information (e.g., a digital watermark) that is to be impressed on the image. The encoder system/method may perform the addition of the signal X to the original image S to form a modified image $X_M$. The modified image $X_M$ may be stored or transmitted or made available to a set of intended recipients. Potential adversaries may attempt to corrupt the impressed information by adding noise Z to the modified image $X_M$. The corresponding decoder system/method may recover the original impressed information from the noise-corrupted image, i.e., the signal $X_M+Z$.

In another application scenario, the encoder system and method embodiments described herein may be used in the context of multiple transmitters and multiple receivers. For example, transmitters $T_A$ and $T_B$ may be interested in transmitting respective messages $m_A$ and $m_B$ to receivers $R_A$ and $R_B$ respectively. If the transmitters $T_A$ and $T_B$ are set up to perform the transmissions to their respective target receivers $R_A$ and $R_B$ at the same time, transmitter $T_A$ can anticipate that it's transmitted signal $X_A$ will be subjected to an additive modification due to the signal $X_B$ to be transmitted by transmitter $T_B$. From the point of view of transmitter $T_A$, the additive modification is channel state information $S_A$. Transmitter $T_B$ can similarly anticipate the additive modification of it's transmitted signal $X_B$. To compensate for these additive modifications, the transmitters $T_A$ and $T_B$ may exchange their messages $m_A$ and $m_B$ through an extra "side" channel prior to transmitting to their respective target receivers $R_A$ and $R_B$. Transmitter $T_A$ can then compute the signal $X_B$, estimate the channel state information $S_A$ from the computed signal $X_B$, and then generate the signal $X_A$ using the message $m_A$ and channel state information $S_A$ according to any of the encoder system/method embodiments described herein.

In yet another application scenario, the encoder system and method embodiments described herein may be used to perform intersymbol interference (ISI) cancellation.

Consider a Gaussian ISI channel modeled by Y=X+S+S'+N, where S and S' are the causal and anti-causal part of the ISI, respectively, and N is the noise. (ISI channels are ubiquitous in communications. For example, telephone channels can often be modeled as ISI channels.) A transmitter may be configured according to any of the system/method embodiments described herein to perform preceding in order to cancel (or compensate for) the ISI in a channel. The causal part S of the ISI is assumed to be known at the transmitter.

The following section describes additional embodiments of systems and method for encoding information and decoding information.

CCSI Using TCQ and IRA Codes

In one set of embodiments, codes are designed based on an algebraic message-based binning interpretation of dirty-paper coding in terms of source-channel coding. From an information-theoretical perspective, there are granular gain and boundary gain in source coding, and packing/coding gain and shaping gain in channel coding. Dirty-paper coding is primarily a channel coding problem (for transmitting messages). Thus, one should consider the packing gain and the shaping gain. In addition, the presence of side information at the encoder system necessitates source coding to satisfy the power constraint. With source coding, the constellation is replicated (e.g., infinitely replicated) so that one can quantize the side information to satisfy the power constraint. Thus source coding in dirty-paper coding is not conventional in the sense that there is granular gain but no boundary gain. We recognize the equivalence between the shaping gain in channel coding and the granular gain in source coding for dirty-paper coding. Then we attempt to achieve the shaping gain via source coding and the packing gain via channel coding. In practice, the former may be done with quantizers (e.g., TCQ-based quantizers) having almost spherical Voronoi cells in a high-dimensional Euclidean space, and the latter with near-capacity channel codes (e.g., IRA codes).

Treating TCQ as a form of lattice VQ, we seamlessly combine TCQ with both non-systematic and systematic IRA codes in a source-channel coding setup without sacrificing the performance of either component. That is: both the TCQ and IRA code components still work their best when combined together in our dirty-paper code constructions. Because of this, the practical performance loss ΔSNR (in dB) in our designs is the sum of the packing loss $\Delta SNR_P$ due to IRA codes and the modulo loss $\Delta SNR_m$ due to TCQ, i.e., $$\Delta SNR = \Delta SNR_P + \Delta SNR_m. \qquad (14)$$

After using the generator polynomial presented in [16] to implement TCQ of different numbers of states and subsequently measuring the equivalent g(Λ), we compute $\Delta SNR_m$ from (3) with C*=0.25 b/s. Assuming that $\Delta SNR_P$=0.34 dB, Table I, shown in FIG. 10, lists the predicted total performance loss ΔSNR when the target rate is C*=0.25 b/s.

Simulations show that the performance of our designs matches the predicted ones in Table I (see FIG. 10) very well. Owing to the efficiency of TCQ and the simplicity of our combined source-channel coding approach, our code designs achieve better performance at lower complexity than the code designs in [7].

Furthermore, our code designs with 256-state TCQ perform better than the code design in [1] with 512-state TCQ.

We view TCQ as an efficient means of implementing an equivalent high-dimensional lattice quantizer Λ and use scalar notation in the sequel. We use the dither D that is uniformly distributed in a cubic lattice cell. Although dithering plays an important role theoretically, we observe little of its impact on the code performance.

Encoding: The side information S is first linearly scaled by α, and then αS+D is quantized to u by a coset of the TCQ selected by the message m so that the obtained quantization error X=u−αS−D satisfies the power constraint $E[X^2] \leq P_X$. X is transmitted over the side-information channel.

Decoding: The decoder receives Y=X+S+Z and finds the codeword û closest to Y'=αY+D=u+N', where N'=(1−α)(−X)+αZ is the equivalent channel noise. Note that the "mod Λ" operation is implicitly implemented in TCQ because its quantization error is bounded. Finally the index of the bin containing û is identified as the decoded message.

In one set of embodiments, our code designs aim to use the strongest possible TCQ to achieve most of the 1.53 dB granular gain so that the distribution of X (and the dither D) approaches Gaussian, while employing IRA codes to approach the capacity. Next we describe embodiments of our code designs with both non-systematic and systematic IRA codes.

A. TCQ Plus Non-Systematic IRA Code Design

Figure 11:
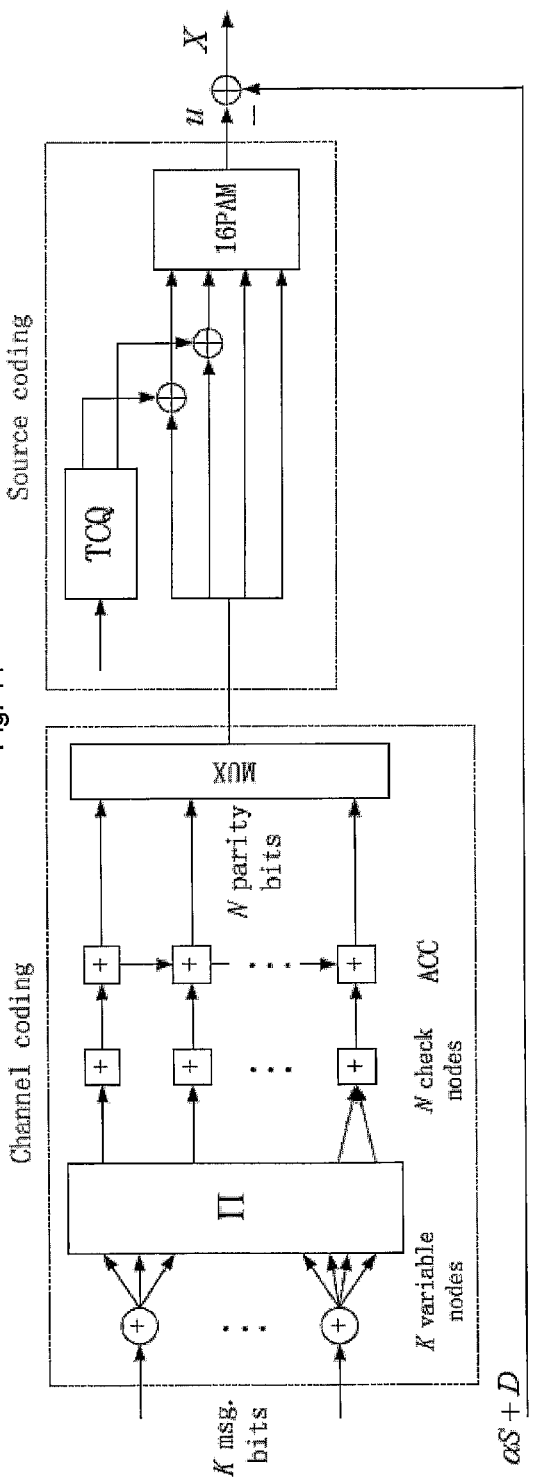
FIG. 11 is block diagram of one embodiment of a dirty-paper encoder based on TCQ and the non-systematic IRA code.

We first present embodiments of our dirty-paper code designs based on 256-, 512-, and 1024-state TCQs (with 1.33, 1.36, and 1.38 dB granular gain, respectively) and non-systematic IRA codes. The encoder is shown in FIG. 11. Each bit of the accumulator (ACC) output sequence is repeated $\log_2 A$ times and the first two resulting bits are combined with the TCQ output bits (via modulo sum) before being used to index an A-PAM constellation. The constellation size A=16 is experimentally chosen among {4, 8, 16, 32} so that the EXIT chart for check node decoding (CND), the ACC, and TCQ starts slightly above the origin. Note that the input to TCQ is determined by the Viterbi algorithm so that αS+D is quantized to u while satisfying the power constraint $P_X$ on the quantization error X. From FIG. 11, it is easy to see that the rate is K/N b/s.

For the CND profile, we introduce bi-regularity to the non-systematic IRA code; that is, a part of the check nodes are of degree 1, which helps move the CND EXIT chart up from the origin. (For more information regarding the use of bi-regularity, please see [7].) Let $a_1$ be the percentage of edges associated with degree −1 check nodes. For various values of $a_1$ and the other check node degree, we examine the CND&ACC&TCQ EXIT charts and select the best CND profiles as:

(a) Degree 1: 60% and degree 2: 40% for 256-state TCQ,
(b) Degree 1: 80% and degree 2: 20% for 512-state TCQ,
(c) Degree 1: 60% and degree 2: 40% for 1024-state TCQ.

The variable node decoding (VND) EXIT chart starts from the origin, so there is a small vertical opening between the starting points of the CND and VND EXIT charts for practical IRA code design.

The decoder, schematically shown in FIG. 12, includes an inner BCJR decoder based on TCQ and ACC, an inner CND, and an outer VND. (BCJR is an acronym for Bahl-Cocke-Jelinek-Raviv.) The BCJR decoder computes the extrinsic information $I_{E,ACC}$ over the joint trellis of TCQ and ACC. Then $I_{E,ACC}$ is forwarded to the inner CND as the a priori information. The CND generates the extrinsic information $I_{E,CND}$ that is forwarded through the edge de-interleaver $\Pi^{-1}$ to the outer VND. The VND generates the extrinsic information $I_{E,VND}$ that is fed back through the edge interleaver Π to the CND. Finally, one decoding iteration is completed by feeding back the extrinsic information generated by the CND to the BCJR decoder.

Figure 13:
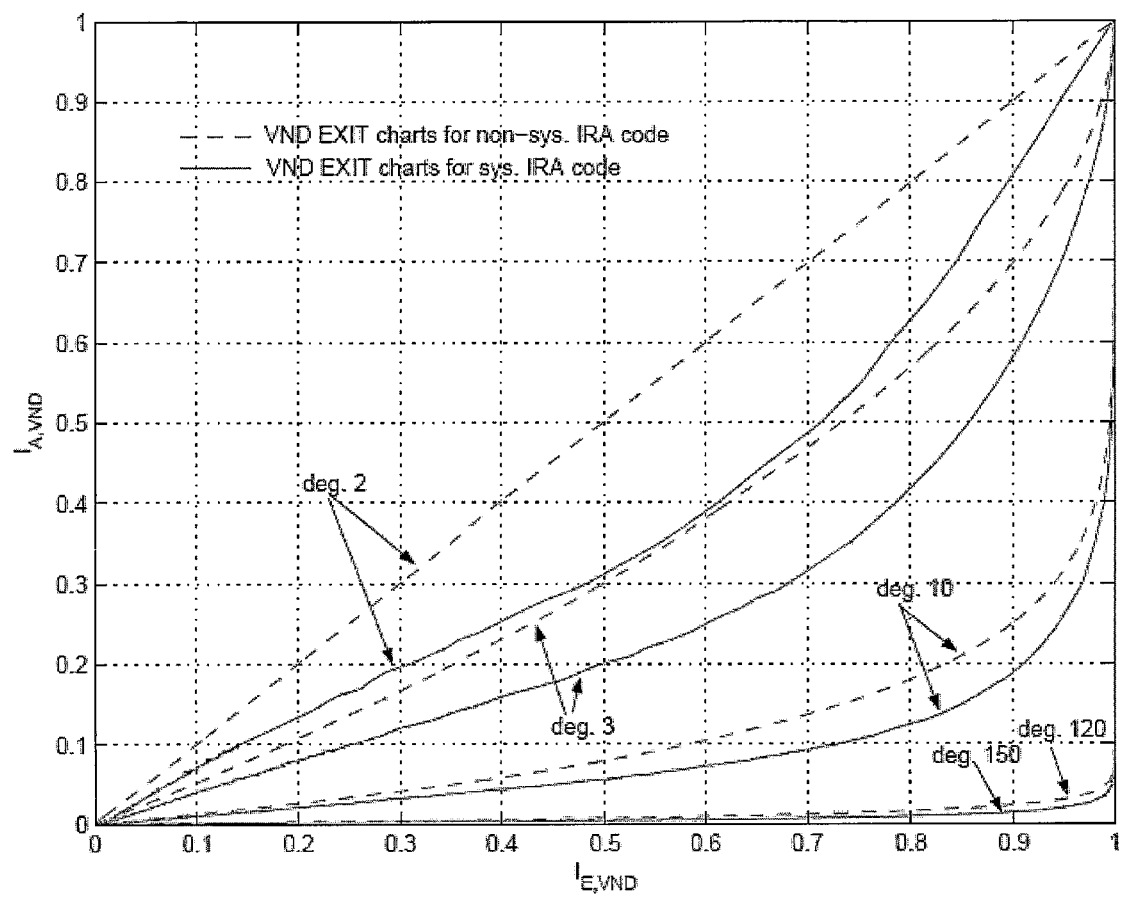
FIG. 13 illustrates VND (variable node decode) EXIT charts with different variable node degrees and with 256-state TCQ.

Based on the VND EXIT charts with different variable node degrees (e.g., dashed curves in FIG. 13 with 256-state TCQ), we design the VND profile by matching the EXIT chart of the CND&ACC&TCQ part.

To achieve the rate of 0.25 b/s, we set K/N=1/4 with:
(a) K=60,000 and N=240,000 bits for 256-state TCQ,
(b) K=30,000 and N=120,000 bits for 512-state TCQ,
(c) K=22,500 and N=90,000 bits for 1024-state TCQ.

The resulting VND profiles are:
(a) Degree 2: 61.29%, degree 3: 22%, degree 10: 14.86%, and degree 120: 1.857% for 256-state TCQ,
(b) Degree 1: 46.17%, degree 2: 38.39%, degree 10: 13.92%, and degree 140: 1.523% for 512-state TCQ,
(c) Degree 2: 64.88%, degree 3: 24.33%, degree 13: 10.17%, and degree 360: 0.627% for 1024-state TCQ.

Figure 14:
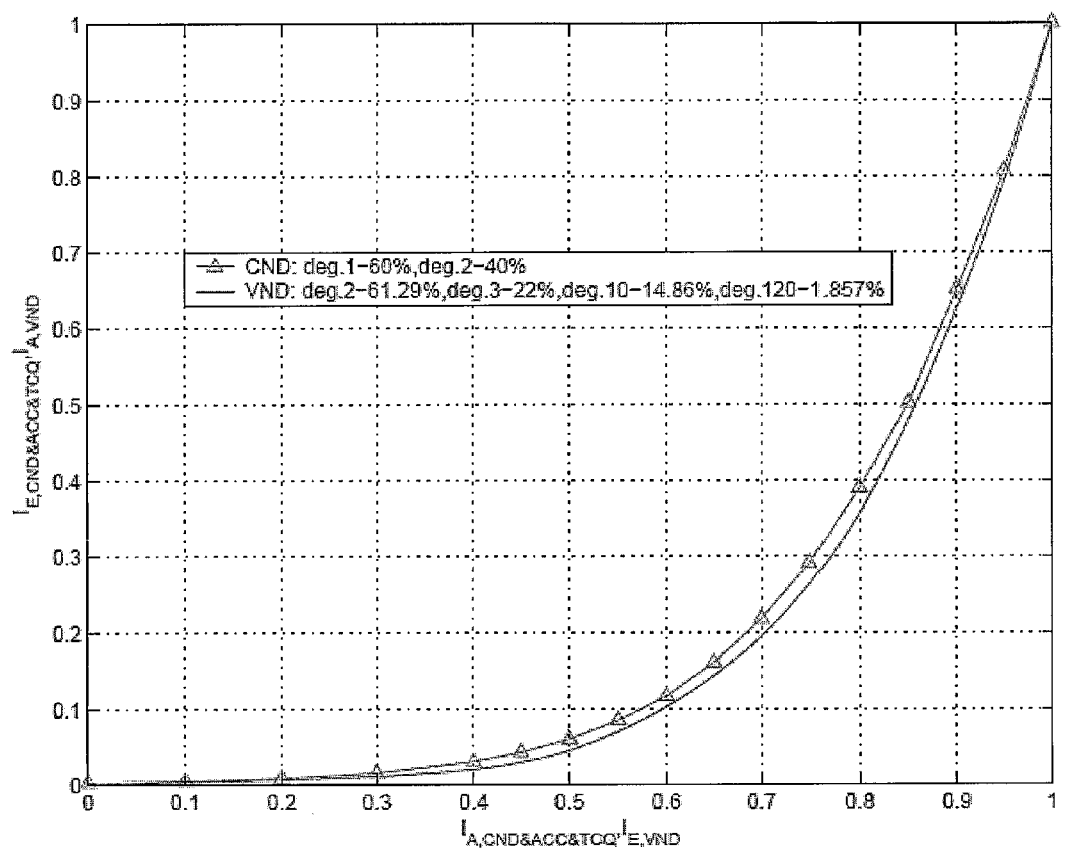
FIG. 14 illustrates EXIT charts of the non-systematic IRA code at SNR=−2.844 dB with K=60,000 and N=240,000 and with 256-state TCQ.
Figure 15:
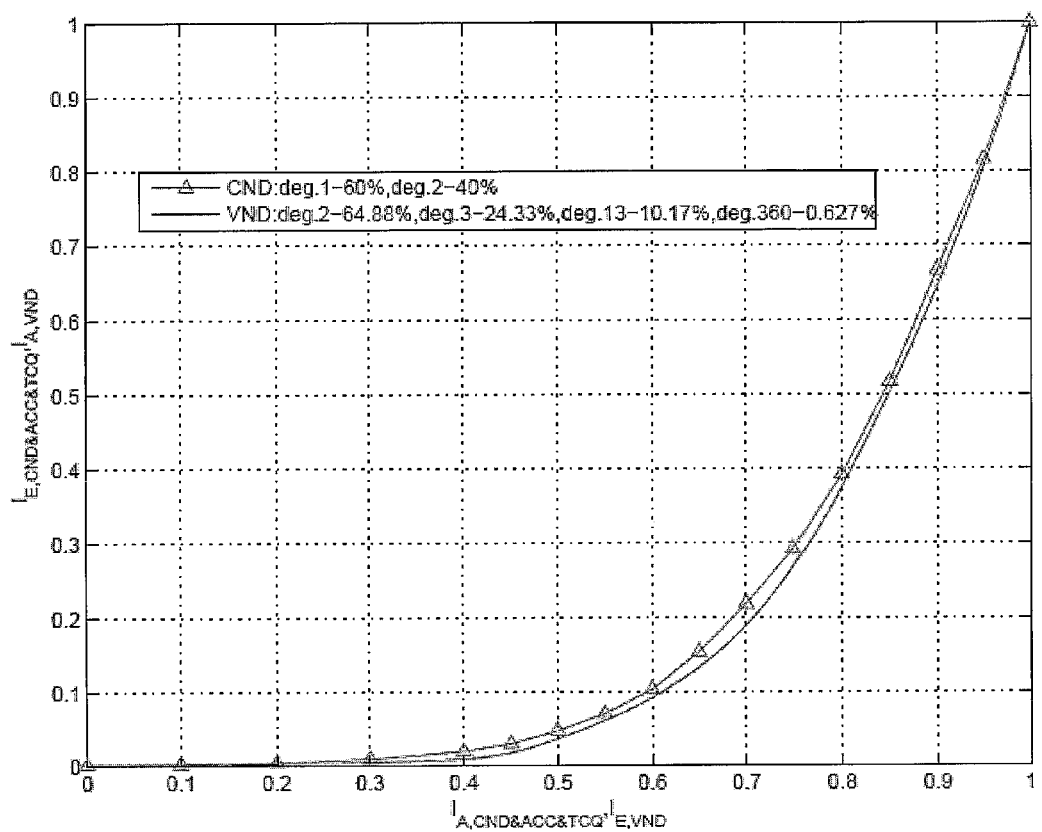
FIG. 15 illustrates EXIT charts of the non-systematic IRA code at SNR=−2.993 dB with K=22,500 and N=90,000 bits and with 1024-state TCQ.

FIGS. 14 and 15 show the EXIT charts of the non-systematic IRA codes with 256- and 1024-state TCQ, respectively. It is seen that in each figure there is a tunnel between the CND&ACC&TCQ and VND EXIT charts, which enables convergence.

B. Simulation Results for the TCQ Plus Non-Systematic IRA Code Design

With 256-state TCQ and the corresponding IRA code, after simulating 50 blocks of transmission, we obtain a bit error rate (BER) of $1.50 \times 10^{-5}$ when SNR=−2.844 dB, which is 0.984 dB away from SNR* for C*=0.25 b/s. This performance is slightly better than the predicted 0.99 dB gap shown in Table I (see FIG. 10) when the granular gain of TCQ is 1.33 dB (again the 0.34 dB packing loss is due to practical IRA coding). The maximal number of decoding iterations is set to be 150 and the actual number to achieve convergence is between 40 and 110.

With 512-state TCQ and the corresponding IRA code, after simulating 100 blocks of transmission, we obtain a BER of $1.56 \times 10^{-5}$ when SNR=−2.9258 dB, which is 0.90 dB away from SNR* at 0.25 b/s, matching the predicted performance in Table I (see FIG. 10). The maximal number of decoding iterations is set to be 150 and the actual number to achieve convergence is between 50 and 115.

With 1024-state TCQ and the corresponding IRA code, after simulating 100 blocks of transmission with our design based on the 1024-state TCQ, we obtain a BER of $4.76 \times 10^{-5}$ when SNR=−2.993 dB, which is 0.83 dB away from the capacity in (3) at 0.25 b/s. This performance also matches the predicted 0.49+0.34=0.83 dB gap in Table I (see FIG. 10) when the granular gain of TCQ is 1.38 dB. The maximal number of decoding iterations is set to be 150 and the actual number to achieve convergence is between 44 and 105.

C. TCQ Plus Systematic IRA Code Design

We now examine embodiments of a dirty-paper code design based on TCQ and systematic IRA codes. We use a systematic IRA code to move the starting point of the VND EXIT chart to the right of the origin. This way, the horizontal opening between the starting points of the CND and VND EXIT charts will allow practical IRA code design. However, we discover that whereas the right shift of the VND EXIT chart from using systematic IRA codes is relatively large for pure channel coding problems, this shift is very small in dirty-paper coding (see the solid curves of FIG. 13 with 256-state TCQ), which involves both source coding and channel coding. We thus additionally employ bi-regularity in CND, which has demonstrated its effectiveness in moving the CND EXIT chart up from the origin in our non-systematic IRA code design. This way, the VND EXIT chart is moved to the right of the origin while the CND EXIT chart moved up from the origin to facilitate IRA code design.

Figure 16:
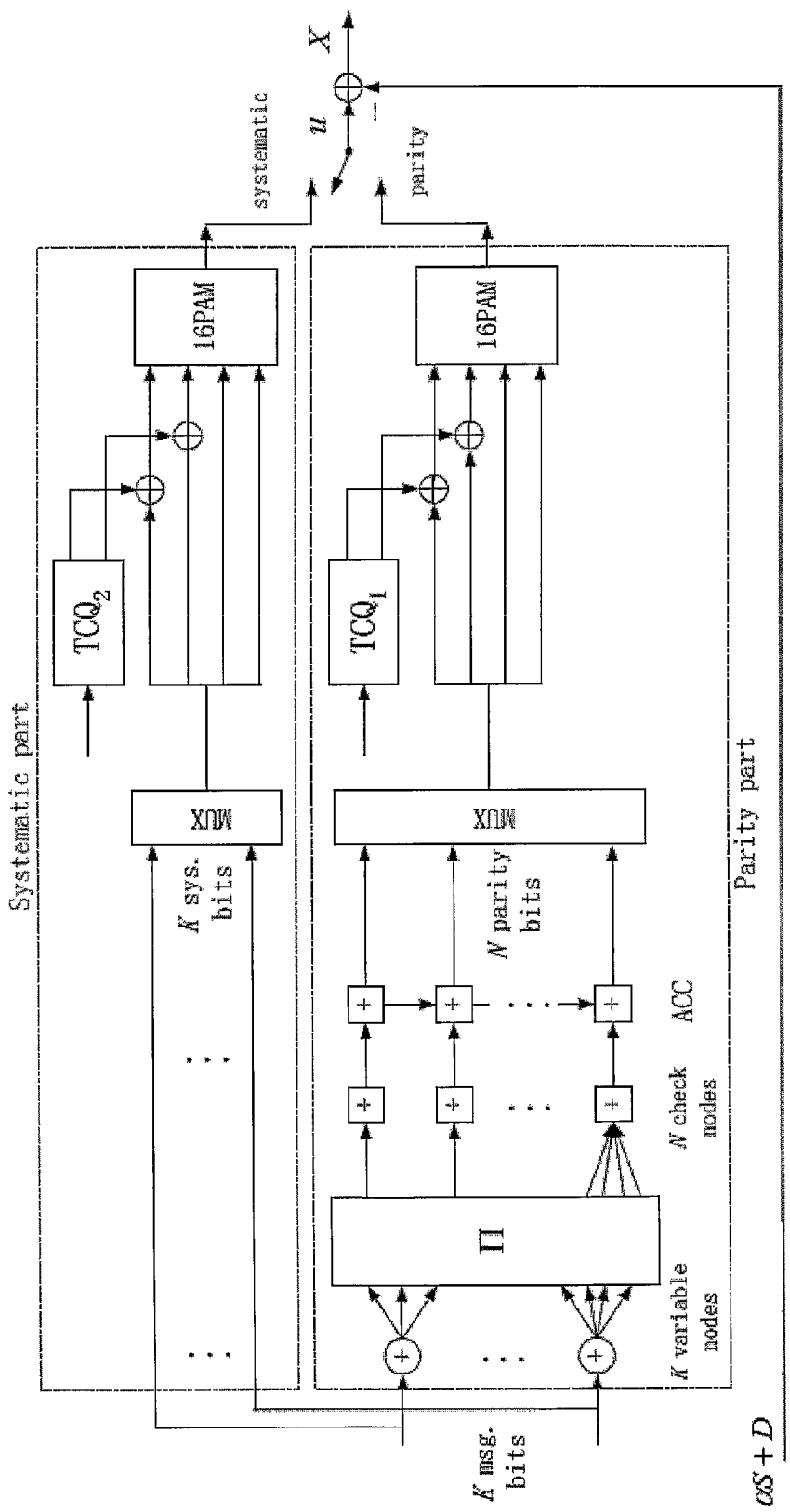
FIG. 16 is a block diagram of one embodiment of a dirty-paper encoder based on TCQ and the systematic IRA code.

One embodiment of an encoder with two TCQs for rate K/(K+N) b/s is shown in FIG. 16. Its "parity part" with $TCQ_1$ is the same as in the non-systematic IRA code of FIG. 11. In general, $TCQ_2$ in the "systematic part" can be different from $TCQ_1$ as long as they are designed such that both satisfy the same power constraint $P_X$. This way, they can be used interchangeably from a power consumption point of view. However, the difference between them lies in their granular gain.

We consider two setups: one employs 256-state $TCQ_1$ and $TCQ_2$ (with an individual/overall granular gain of 1.33 dB); another uses a 512-state $TCQ_1$ (with 1.36 dB granular gain) and a 1024-state $TCQ_2$ (with 1.38 dB granular gain) for an overall granular gain of 1.3662 dB in source coding. In each setup, we compare the CND&ACC&$TCQ_1$ EXIT charts and select the CND profiles as:
(a) Degree 1: 73.33% and degree 4: 26.67% for 256-state $TCQ_1$ and $TCQ_2$,
(b) Degree 1: 73.33% and degree 4: 26.67% for 512-state $TCQ_1$ and 1024-state $TCQ_2$.

The decoder system is schematically shown in FIG. 17, where two BCJR decoders are used. For the "systematic part", we compute the a priori information $I_{A,TCQ2}$ based on the extrinsic information from the VND. Then the output extrinsic information $I_{E,TCQ2}$ is fed back to the VND. The decoder for the "parity part" resembles that in our non-systematic IRA code design.

Due to the presence of the BCJR decoder corresponding to the "systematic part", we evaluate the VND&$TCQ_2$ EXIT charts via simulations, in which we set K/N=1/3 so that the rate K/(K+N)=0.25 b/s with:
(a) K=60,000 bits and N=180,000 for 256-state $TCQ_1$ and $TCQ_2$; and
(b) K=30,000 bits and N=90,000 for 512-state $TCQ_1$ and 1024-state $TCQ_2$.

We design the VND profile by matching the EXIT chart of the CND&ACC&$TCQ_1$ part.

The resulting VND profiles are:
(a) Degree 2: 58.45%, degree 3: 23.38%, degree 10: 16.94%, and degree 150: 1.223% for 256-state $TCQ_1$ and $TCQ_2$; and
(b) Degree 1: 57.24%, degree 2: 31.23%, degree 10: 9.98%, and degree 150: 1.55% for 512-state $TCQ_1$ and 1024-state $TCQ_2$.

Figure 18:
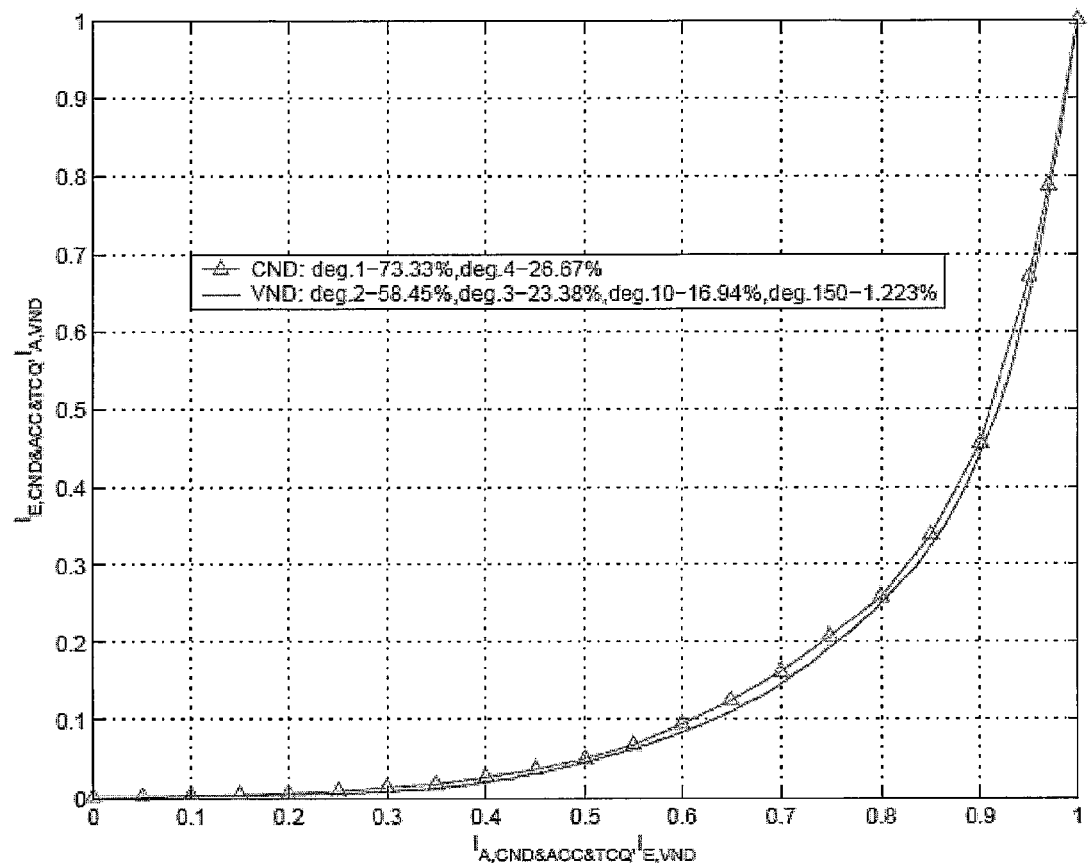
FIG. 18 illustrates EXIT charts of the systematic IRA code at SNR=−2.844 dB with K=60,000 and N=180,000. Both $TCQ_1$ and $TCQ_2$ have 256 states.
Figure 19:
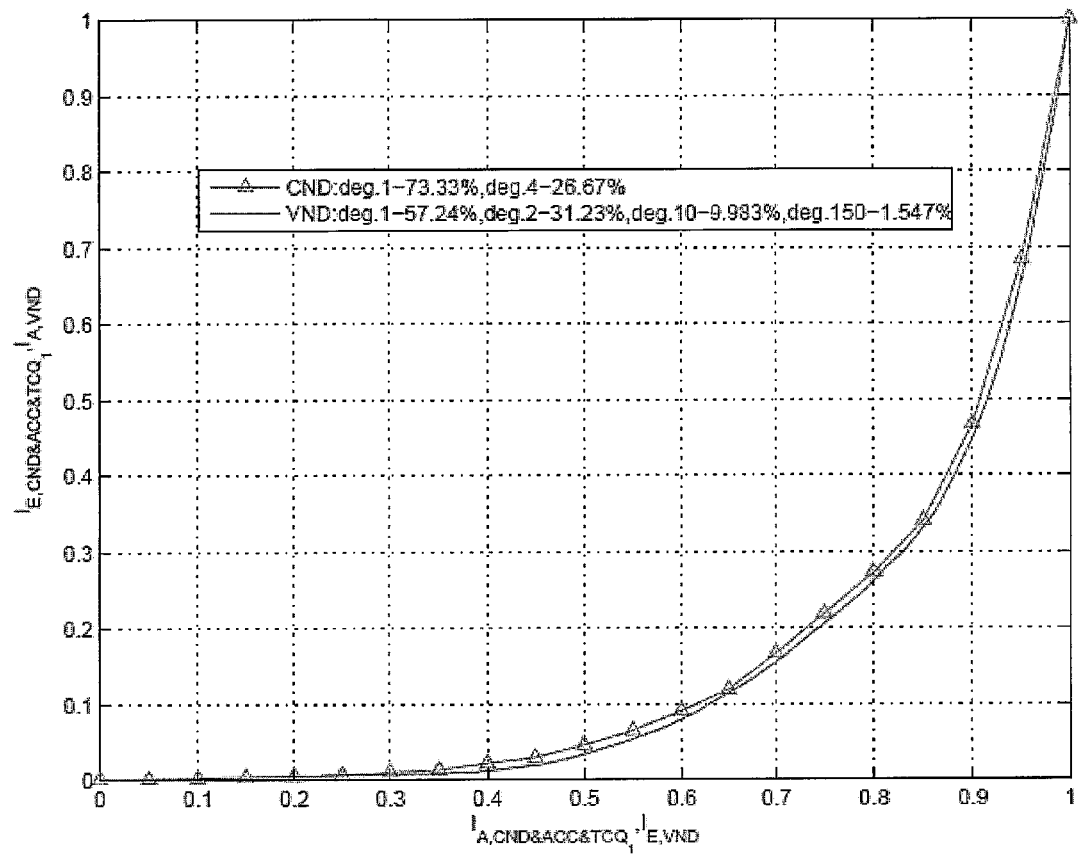
FIG. 19 illustrates EXIT charts of the systematic IRA code at SNR=−2.945 dB with K=30,000 and N=90,000 bits. $TCQ_1$ has 512 states and $TCQ_2$ has 1024 states.

FIGS. 18 and 19 show the EXIT charts of the systematic IRA codes in our two setups. Again, we see a convergence enabling tunnel between the CND&ACC&$TCQ_1$ and VND&$TCQ_2$ EXIT charts in each figure.

D. Simulation Results for the TCQ Plus Systematic IRA Code Design

For the setup with 256-state $TCQ_1$ and $TCQ_2$, we simulate 50 blocks of transmission at 0.25 b/s (as in the case with non-systematic IRA codes and 256-state TCQ), and obtain a BER of $2.08 \times 10^{-5}$ at the 0.984 dB gap from SNR*. The maximal number of decoding simulations is again 150 and the actual number to achieve convergence is between 50 and 115.

In the setup with 512-state $TCQ_1$ and a 1024-state $TCQ_2$, 20 blocks of transmission are simulated at 0.25 b/s. We obtain a BER of $5.0 \times 10^{-5}$ when SNR=−2.945 dB, which is 0.883 dB away from SNR* at 0.25 b/s. The maximal number of decoding iterations is set to be 150 and the actual number to achieve convergence is between 40 and 100.

E. Several Embodiments

As noted above, our code designs may use BCJR decoding. Each BCJR decoding iteration includes a number of loop operations.

Figure 20:
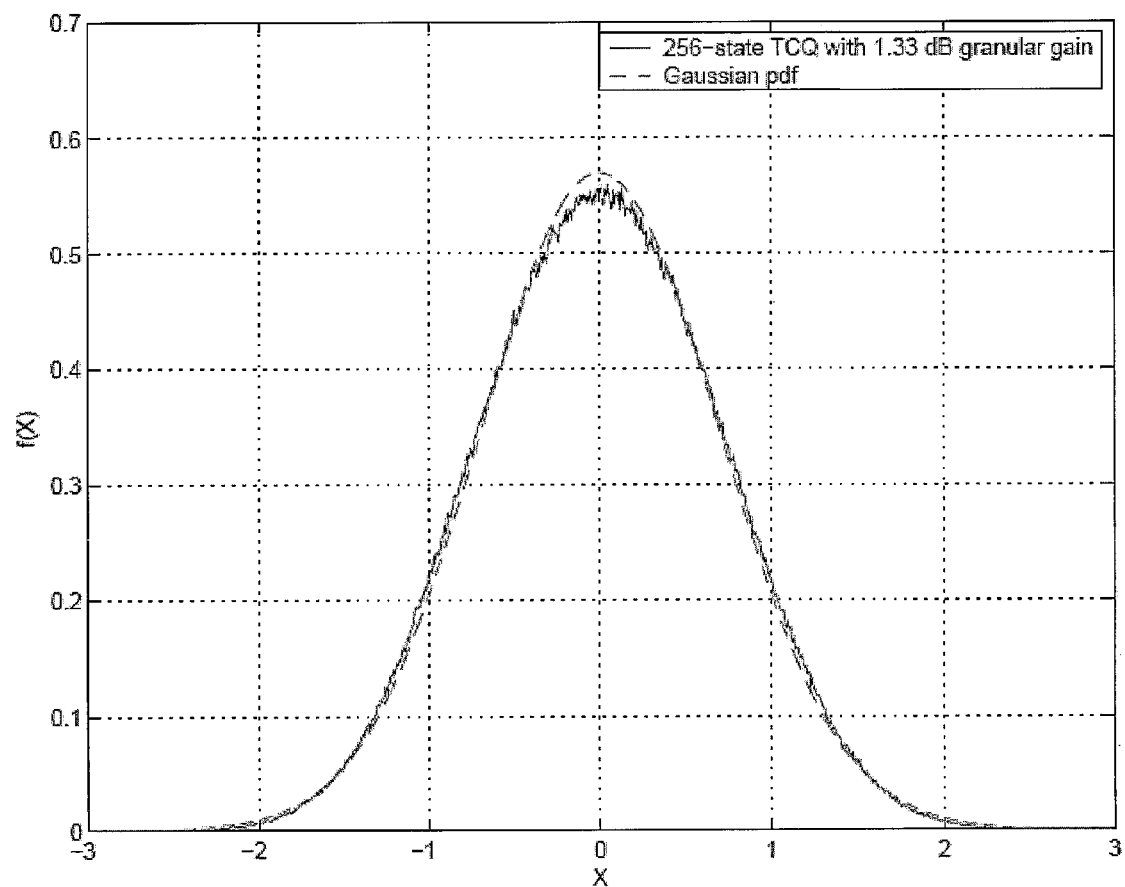
FIG. 20 is a PDF of quantization error X with the 256-state TCQ in embodiments of our dirty-paper code designs, together with a Gaussian PDF.

In one embodiment of our design, based on the non-systematic IRA code and 256-state TCQ, K=60,000, N=240,000 bits, the number of input bits is 1(TCQ)+1(ACC)=2. The BCJR decoder thus executes $2^{(8+1)} \times 2^2 \times 240,000 = 512 \times 4 \times 240,000$ loop operations per iteration. Note that in FIG. 20 the pdf of quantization error with the 256-state TCQ, in our code design, is very close to being Gaussian.

In another embodiment of our design, based on the systematic IRA code and 256-state TCQs, K=60,000 and N=180,000, the number of input bits is $1(TCQ_2)+1$(systematic bit)=2 for the "systematic part" and $1(TCQ_1)+1(ACC)=2$ for the "parity part". In the "systematic part", the total number of loop operations is:

$$2^8 \times 2^2 \times 60,000 = 256 \times 4 \times 60,000.$$

In the "parity part", the number is $$2^{(8+1)} \times 2^2 \times 180,000 = 512 \times 4 \times 180,000.$$

The combined number of loop operations is thus $512 \times 4 \times 210,000$ per iteration, which is 7/8 of the complexity of our design based on the non-systematic IRA code.

Finally, the total number of loop operations in our code designs using 512-state TCQ and the non-systematic IRA code (with K=30,000 and N=120,000) and using 512-state $TCQ_1$, 1024-state $TCQ_2$ and the systematic IRA code (with K=30,000 and N=90,000) is the same at $512 \times 4 \times 240,000$ per BCJR decoding iteration.

Conclusions

We have addressed the problem of near-capacity dirty-paper code designs based on TCQ and IRA codes. The source-channel coding approach we take enables us to seamlessly combine TCQ and IRA codes in a dirty-paper code and to see a separate modulo loss due to source coding and the packing loss due to channel coding.

The code designs presented herein are applicable in a number of fields, including (but not limited to): dirty-paper coding to image data-hiding, coding for MIMO broadcast channels, and transmitter cooperation in wireless ad hoc networks.

LIST OF REFERENCES

[1] A. Bennatan, D. Burshtein, G. Caire, and S. Shamai, "Superposition coding for side-information channels," IEEE Trans. Inform. Theory, vol. 52, pp. 1872-1889, May 2006.

[2] B. Chen and G. Wornell, "Achieving performance of digital watermarking systems," in Proc. IEEE Int. Conf. Multimedia Comput. Syst., Florence, Italy, June 1999.

[3] J. Chou, S. Pradhan, and K. Ramchandran, "Turbo coded trellis-based constructions for data embedding: channel coding with side information," in Proc. of 35th Asilomar Conf. Signals, Systems and Computers, Pacific Grove, Calif., November 2001.

[4] J. Conway and J. Sloane, "Sphere Packings, Lattices and Groups", Springer, N.Y., 1998.

[5] M. Costa, "Writing on dirty paper," IEEE Trans. Inform. Theory, vol. 29, pp. 439-441, May 1983.

[6] J. Eggers, R. Bäuml, R. Tzschoppe, and B. Girod, "Scalar Costa scheme for information embedding," IEEE Trans. Signal Processing, vol. 51, pp. 1003-1019, April 2003.

[7] U. Erez and S. ten Brink, "A close-to-capacity dirty paper coding scheme," IEEE Trans. Inform. Theory, vol. 51, pp. 3417-3432, October 2005.

[8] S. Gelfand and M. Pinsker, "Coding for channel with random parameters," Probl. Contr. and Inform. Theory, vol. 9, pp. 19-31, 1980.

[9] H. Jin, A. Khandekar, and R. McEliece, "Irregular repeat-accumulate codes," in Proc. 2nd Intl. Symp. Turbo codes and Related Topics, pp. 1-8, September 2000.

[10] M. Marcellin and T. Fischer, "Trellis coded quantization of memoryless and Gaussian-Markov sources," IEEE Trans. Communications, vol. 38, pp. 82-93, January 1990.

[11] V. Stanković, A. Host-Madsen, and Z. Xiong, "Cooperative diversity for wireless ad hoc networks: Capacity bounds and code designs," IEEE Signal Processing Magazine, vol. 22, pp. 37-49, September 2006.

[12] Y. Sun, A. Liveris, V. Stanković, and Z. Xiong, "Near-capacity dirty-paper code design: A source-channel coding approach," in Proc. CISS'05, Baltimore, Md., March 2005.

[13] Y. Sun, A. Liveris, V. Stanković, and Z. Xiong, "Near-capacity dirty-paper code designs based on TCQ and IRA codes," in Proc. ISIT'05, Adelaide, Australia, September 2005.

[14] Wikipedia entry on dithering at http://en.wikipedia.org/wiki/Dithering

[15] S. ten Brink, "Convergence behavior of iteratively decoded parallel concatenated codes," IEEE Trans. Communications, vol. 49, pp. 1727-1737, October 2001.

[16] G. Ungerboeck, "Channel coding with multilevel/phase signals," IEEE Trans. Inform. Theory, vol. 28, pp. 55-67, January 1982.

[17] M. Uppal, V. Stanković, and Z. Xiong, "Code design for MIMO broadcast channels," in Proc. ISIT'06, Seattle, Wash., July 2006.

[18] Z. Xiong, V. Stanković, S. Cheng, A. Liveris, and Y. Sun, "Source-channel coding for algebraic multiterminal binning," in Proc. ITW'04, San Antonio, Tex., October 2004.

[19] Y. Yang, S. Cheng, Z. Xiong, and W. Zhao, "Wyner-Ziv coding based on TCQ and LDPC codes," in Proc. of 37th Asilomar Conference on Signals, Systems, and Computers, Pacific Grove, Calif., November 2003.

[20] Y. Yang, Y. Sun, V. Stanković, and Z. Xiong, "Image data-hiding based on capacity-approaching dirty-paper coding," in Proc. SPIE EI'06: Security, Steganography, and Watermarking of Multimedia Contents VIII, San Jose, Calif., January 2006.

[21] Y. Yang, V. Stanković, Z. Xiong, and W. Zhao, "On multiterminal source code design," in Proc. DCC'05, Snowbird, Utah, March 2005.

[22] W. Yu, D. Varodayan, and J. Cioffi, "Trellis and convolutional preceding for transmitter-based interference pre-subtraction," IEEE Trans. Communications, vol. 53, July 2005.

[23] R. Zamir, S. Shamai, and U. Erez, "Nested linear/lattice codes for structured multiterminal binning," IEEE Trans. Inform. Theory, vol. 48, pp. 1250-1276, June 2002.

What is claimed is:

1. A method for encoding data, the method comprising:
performing, using a processor, irregular repeat accumulate (IRA)-based channel coding on a set of message bits in order to generate a stream of expanded parity words;
performing, using the processor, source coding on the stream of expanded parity words to generate a modulated signal, wherein said performing source coding includes modifying the expanded parity words using output from a trellis coded quantization;
providing the modulated signal for processing with a channel state signal, to generate an output signal X.

2. The method of claim 1, wherein the output from the trellis-coded quantization is generated in response to an input vector b supplied to the trellis-coded quantization, wherein the input vector b has been selected so that the output signal X satisfies a power constraint.

3. The method of claim 1, wherein said performing source coding also includes performing pulse amplitude modulation based on the modified expanded parity words to obtain the modulated signal.

4. The method of claim 1 further comprising subtracting a scaled and dithered version of the channel state signal from the modulated signal to obtain the output signal X.

5. The method of claim 1 further comprising transmitting the output signal over a channel to one or more destinations.

6. The method of claim 1 further comprising storing the output signal in a memory medium.

7. A method for encoding data, the method comprising:
performing, using a processor, irregular repeat accumulate (IRA)-based channel coding on message bits in order to generate a stream of expanded parity words;
performing, using the processor, first source coding on the stream of expanded parity words to generate a first modulated signal, wherein said performing first source coding includes modifying the expanded parity words using output from a first trellis coded quantization;
expanding, using the processor, the message bits to obtain expanded message words;
performing, using the processor, second source coding on the stream of expanded message words to generate a second modulated signal, wherein said performing second source coding includes modifying the expanded message words using output from a second trellis coded quantization;
generating, using the processor, a signal u from the first modulated signal and the second modulated signal,
providing the signal u for processing with a channel state signal, to generate an output signal X.

8. The method of claim 7, wherein the output from the first trellis-coded quantization is generated in response to an input vector $b_p$ supplied to the first trellis-coded quantization, wherein the output from the second trellis-coded quantization is generated in response to an input vector $b_s$ supplied to the second trellis-coded quantization, wherein the input vectors $b_p$ and $b_s$ have been selected so that the output signal X satisfies a power constraint.

9. The method of claim 7, wherein said performing first source coding also includes performing pulse amplitude modulation based on the modified expanded parity words to obtain the first modulated signal.

10. The method of claim 7, wherein said performing second source coding also includes performing pulse amplitude modulation based on the modified expanded message words to obtain the second modulated signal.

11. The method of claim 7 further comprising subtracting a scaled and dithered version of the channel state signal from the signal u to obtain the output signal X.

12. The method of claim 7 further comprising transmitting the output signal X over a channel to one or more destinations.

13. The method of claim 7 further comprising storing the output signal X in a memory medium.

14. A computer system for encoding data, the computer system comprising:
a memory configured to store program instructions;
a processor configured to access the program instructions from the memory and to execute the program instructions, wherein the program instructions are executable to:
perform irregular repeat accumulate (IRA)-based channel coding on a set of message bits in order to generate a stream of expanded parity words;
perform source coding on the stream of expanded parity words to generate a modulated signal, wherein said performing source coding includes modifying the expanded parity words using output from a trellis coded quantization;
providing the modulated signal for processing with a channel state signal, to generate an output signal X.

15. The computer system of claim 14, wherein the output from the trellis-coded quantization is generated in response to an input vector b supplied to the trellis-coded quantization, wherein the input vector b has been selected so that the output signal X satisfies a power constraint.

16. The computer system of claim 14, wherein said performing source coding also includes performing pulse amplitude modulation based on the modified expanded parity words to obtain the modulated signal.

17. The computer system of claim 14, wherein the program instructions are also executable to subtract a scaled and dithered version of the channel state signal from the modulated signal to obtain the output signal X.

18. The computer system of claim 14, wherein the program instructions are also executable to transmit the output signal over a channel to one or more destinations.

19. The computer system of claim 14, wherein the program instructions are also executable to store the output signal in a memory medium.

20. A computer-accessible memory medium configured to store program instructions, wherein the program instructions are executable to:
perform irregular repeat accumulate (IRA)-based channel coding on a set of message bits in order to generate a stream of expanded parity words;
perform source coding on the stream of expanded parity words to generate a modulated signal, wherein said performing source coding includes modifying the expanded parity words using output from a trellis coded quantization;
providing the modulated signal for processing with a channel state signal, to generate an output signal X.

21. The memory medium of claim 20, wherein the output from the trellis-coded quantization is generated in response to an input vector b supplied to the trellis-coded quantization, wherein the input vector b has been selected so that the output signal X satisfies a power constraint.

22. The memory medium of claim 20, wherein said performing source coding also includes performing pulse amplitude modulation based on the modified expanded parity words to obtain the modulated signal.

23. The memory medium of claim 20, wherein the program instructions are also executable to subtract a scaled and dithered version of the channel state signal from the modulated signal to obtain the output signal X.

24. The memory medium of claim 20, wherein the program instructions are also executable to transmit the output signal over a channel to one or more destinations.

25. The memory medium of claim 20, wherein the program instructions are also executable to store the output signal in a memory medium.

26. An apparatus configured to encode data, the apparatus comprising:
a means for performing irregular repeat accumulate (IRA)-based channel coding on a set of message bits in order to generate a stream of expanded parity words;

a means for performing source coding on the stream of expanded parity words to generate a modulated signal, wherein said performing source coding includes modifying the expanded parity words using output from a trellis coded quantization, wherein the modulated signal is provided for processing with a channel state signal, to generate an output signal X.

27. An apparatus configured to encode data, the apparatus comprising:

a processor;

tangible, non-transitory computer-readable medium having computer-executable instructions stored thereon that, if executed by the processor, cause the processor to perform operations comprising:

inner decoding an input signal in order to generate first feedforward information, wherein the inner decoding includes (a) performing trellis decoding on the input signal over a joint trellis corresponding at least to an accumulator portion of an irregular repeat accumulate (IRA) encoder and a trellis coded quantization and (b) performing first check node decoding on data including a modified version of output from the trellis decoding, wherein the first feedforward information is a modified version of output from the first check node decoding;

outer decoding a permuted version of the first feedforward information in order to generate first feedback information, wherein said outer decoding includes performing variable node decoding, corresponding to variable nodes of the IRA encoder, on the permuted version of the first feedforward information, wherein the first feedback information is a modified version of output from the variable node decoding;

wherein the output of the variable node decoding is provided to determine an estimate for the message bits.

28. An apparatus configured to encode data, the apparatus comprising:

a means for inner decoding an input signal in order to generate first feedforward information, wherein the inner decoding includes (a) performing trellis decoding on the input signal over a joint trellis corresponding at least to an accumulator portion of an irregular repeat accumulate (IRA) encoder and a trellis coded quantization and (b) performing first check node decoding on data including a modified version of output from the trellis decoding, wherein the first feedfonNard information is a modified version of output from the first check node decoding;

a means for outer decoding a permuted version of the first feedforward information in order to generate first feedback information, wherein said outer decoding includes performing variable node decoding, corresponding to variable nodes of the IRA encoder, on the permuted version of the first feedforward information, wherein the first feedback information is a modified version of output from the variable node decoding;

wherein the output of the variable node decoding is provided to determine an estimate for the message bits.

29. An apparatus configured to encode data, the apparatus comprising:

a processor;

tangible, non-transitory computer-readable medium having computer-executable instructions stored thereon that, if executed by the processor, cause the processor to perform operations comprising:

performing irregular repeat accumulate (IRA) -based channel coding on message bits in order to generate a stream of expanded parity words;

performing first source coding on the stream of expanded parity words to generate a first modulated signal, wherein said performing first source coding includes modifying the expanded parity words using output from a first trellis coded quantization;

expanding the message bits to obtain expanded message words;

performing second source coding on the stream of expanded message words to generate a second modulated signal, wherein said performing second source coding includes modifying the expanded message words using output from a second trellis coded quantization;

generating a signal u from the first modulated signal and the second modulated signal, providing the signal u for processing with a channel state signal, to generate an output signal X.

30. An apparatus configured to encode data, the apparatus comprising:

means for performing irregular repeat accumulate (IRA) -based channel coding on message bits in order to generate a stream of expanded parity words;

means for performing first source coding on the stream of expanded parity words to generate a first modulated signal, wherein said performing first source coding includes modifying the expanded parity words using output from a first trellis coded quantization;

means for expanding the message bits to obtain expanded message words;

performing second source coding on the stream of expanded message words to generate a second modulated signal, wherein said performing second source coding includes modifying the expanded message words using output from a second trellis coded quantization;

means for generating a signal u from the first modulated signal and the second modulated signal, means for providing the signal u for processing with a channel state signal, to generate an output signal X.

31. An apparatus configured to encode data, the apparatus comprising:

a processor;

tangible, non-transitory computer-readable medium having computer-executable instructions stored thereon that, if executed by the processor, cause the processor to perform operations comprising:

performing, using a processor, first decoding operations on a parity portion of the input signal in order to generate first feedforward information, wherein said performing first decoding operations includes (a) performing a first trellis decoding on the parity portion over a joint trellis corresponding at least to an accumulator portion of an irregular repeat accumulate (IRA) encoder and a first trellis coded quantization and (b) performing first check node decoding on data including a modified version of output from the first trellis decoding, wherein the first feedforward information is a modified version of output from the first check node decoding;

performing, using the processor, second decoding operations on a systematic portion of the input signal and a permuted version of the first feedforward information in order to generate first feedback information and second feedback information, wherein said performing second decoding operations includes (c) performing a second trellis decoding on the systematic portion over a trellis corresponding to a second trellis coded quantization and (d) performing variable node decoding on the permuted version of the first feedforward information and a modified version of output from the second trellis decoding, wherein the first feedback information and the second feedback information are outputs of the variable node decoding;

wherein the second feedback information is provided to determine an estimate for the message bits.

32. An apparatus configured to encode data, the apparatus comprising:

a means for performing first decoding operations on a parity portion of the input signal in order to generate first feedforward information, wherein said performing first decoding operations includes (a) performing a first trellis decoding on the parity portion over a joint trellis corresponding at least to an accumulator portion of an irregular repeat accumulate (IRA) encoder and a first trellis coded quantization and (b) performing first check node decoding on data including a modified version of output from the first trellis decoding, wherein the first feedforward information is a modified version of output from the first check node decoding;

a means for performing second decoding operations on a systematic portion of the input signal and a permuted version of the first feedforward information in order to generate first feedback information and second feedback information, wherein said performing second decoding operations includes (c) performing a second trellis decoding on the systematic portion over a trellis corresponding to a second trellis coded quantization and (d) performing variable node decoding on the permuted version of the first feedforward information and a modified version of output from the second trellis decoding, wherein the first feedback information and the second feedback information are outputs of the variable node decoding;

wherein the second feedback information is provided to determine an estimate for the message bits.

* * * * *

UNITED STATES PATENT AND TRADEMARK OFFICE
CERTIFICATE OF CORRECTION

PATENT NO. : 8,020,082 B2  
APPLICATION NO. : 11/684427  
DATED : September 13, 2011  
INVENTOR(S) : Sun et al.

Page 1 of 1

It is certified that error appears in the above-identified patent and that said Letters Patent is hereby corrected as shown below:

IN THE CLAIMS:

Column 27, line 40, In Claim 8, delete "by" and insert -- $b_P$ --.

Column 29, line 48, In Claim 28, delete "feedfonNard" and insert -- feedforward --.

Column 30, line 1, In Claim 29, delete "(IRA) -based" and insert -- (IRA)-based --.

Column 30, lines 23-24, In Claim 30, delete "(IRA) -based" and insert -- (IRA)-based --.

Signed and Sealed this  
Twenty-seventh Day of March, 2012

David J. Kappos  
*Director of the United States Patent and Trademark Office*